(12) United States Patent
Ha et al.

(10) Patent No.: US 11,024,654 B2
(45) Date of Patent: Jun. 1, 2021

(54) DISPLAY PANEL INCLUDING LINK LINES

(71) Applicant: LG Display Co., Ltd., Seoul (KR)

(72) Inventors: Jongmoo Ha, Paju-si (KR); NamKil Park, Paju-si (KR); Daewon Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/594,585

(22) Filed: Oct. 7, 2019

(65) Prior Publication Data

US 2020/0135764 A1 Apr. 30, 2020

(30) Foreign Application Priority Data

Oct. 26, 2018 (KR) .......................... 10-2018-0128714

(51) Int. Cl.
*G09G 3/36* (2006.01)
*G09G 3/30* (2006.01)
*H01L 27/12* (2006.01)
*G02F 1/1362* (2006.01)
*G09G 3/20* (2006.01)

(52) U.S. Cl.
CPC ...... *H01L 27/124* (2013.01); *G02F 1/136286* (2013.01); *G09G 3/20* (2013.01); *G09G 2310/0264* (2013.01)

(58) Field of Classification Search
CPC ............................................ G09G 2300/0426
See application file for complete search history.

(56) References Cited

U.S. PATENT DOCUMENTS

| | | | |
|---|---|---|---|
| 8,432,523 B2 | 4/2013 | Shin et al. | |
| 8,638,280 B2 | 1/2014 | Nonaka | |
| 2014/0139771 A1* | 5/2014 | Choi | H01L 27/3276 349/43 |
| 2017/0116923 A1 | 4/2017 | Bae et al. | |
| 2018/0075810 A1* | 3/2018 | Kim | G09G 3/3275 |
| 2018/0166037 A1* | 6/2018 | Lee | G09G 3/3677 |
| 2018/0322837 A1 | 11/2018 | Sakurai et al. | |

FOREIGN PATENT DOCUMENTS

| | | | |
|---|---|---|---|
| KR | 10-2010-0062290 A | 6/2010 | |
| WO | 2017/086273 A1 | 5/2017 | |

* cited by examiner

*Primary Examiner* — Nan-Ying Yang
(74) *Attorney, Agent, or Firm* — Morgan, Lewis & Bockius LLP

(57) ABSTRACT

A display panel includes: a display area including: a curved boundary in plan view, and a pixel array including pixel rows, and a non-display area in a periphery of the display area, and including: a curved boundary in plan view, a plurality of gate blocks arranged along the curved boundary of the non-display area, and at least one dummy block among the gate blocks, and a plurality of link lines configured to connect the gate blocks to the pixel rows, at least one of the link lines being multi-segmented to include a plurality of segments oriented in different directions in plan view.

17 Claims, 9 Drawing Sheets

DISPLAY PANEL INCLUDING LINK LINES

CROSS-REFERENCE TO RELATED APPLICATION(S)

This application claims the benefit of and priority to Korean Patent Application No. 10-2018-0128714, filed on Oct. 26, 2018, the entirety of which is hereby incorporated by reference.

BACKGROUND

1. Technical Field

The present disclosure relates to a display panel, and more particularly, to a display panel provided in different shapes, other than a rectangular shape, and including a driving circuit.

2. Discussion of the Related Art

A wearable device, a flexible device, and a vehicle display device may have a non-rectangular display panel in various shapes, instead of a rectangular shape. For example, a display panel with in a circular plate shape may be applied to a clock, and a curved-corner rectangular display panel may be applied to a smart-phone.

A driving circuit of a display panel includes a pixel array configured to display an image, a data driver configured to supply a data signal to data lines of the pixel array, a gate driver configured to sequentially supply a gate signal to gate lines of the pixel array, and a timing controller configured to control the data driver and the gate driver. In a related art, a display device is realized by connecting an additional gate drive integrated circuit (IC) to a display panel. However, this causes the increase of cost in the display device due to the IC cos. Also, a non-display area has an increased width due to the increased number of link lines that connect the gate driver with the gate lines.

Recently, a technique for embedding a gate driver together with a pixel array in a display panel has been applied. The gate driver embedded in the display panel is known as a gate-in-panel (GIP) circuit. The GIP circuit includes a shift register. The shift register includes a plurality of stages connected dependently. The stages each generate an output in response to a start pulse, and shift the output in accordance with a shift clock. The shift register is supplied with a start pulse, a shift clock, a driving voltage, etc.

When the GIP circuit is embedded in the display panel, it is possible to decrease the number of link lines. However, it is difficult to decrease a size of a non-display area. To secure a space for lines that supply the start pulse, the shift clock, and the driving voltage to the stages of the GIP circuit, the GIP circuit is enlarged in a left-to-right direction. Also, the plurality of link lines in the display panel, including a non-rectangular portion extend from a gate line, and are provided in a straight-line shape so that the plurality of link lines are not connected to the gate driver, whereby a size of a non-display area may be increased in accordance with a structure of the link lines. To overcome these problems, various methods for reducing a non-display area in a non-rectangular display panel with a gate driver have been studied.

SUMMARY

Accordingly, the present disclosure is directed to a display panel including link lines that substantially obviates one or more of the issues due to limitations and disadvantages of the related art.

An aspect of the present disclosure is to provide a structure of a link line that facilitates a decrease in a size of a non-display area, and a display panel using the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display panel, including: a display area including: a curved boundary in plan view, and a pixel array including pixel rows, and a non-display area in a periphery of the display area, and including: a curved boundary in plan view, a plurality of gate blocks arranged along the curved boundary of the non-display area, and at least one dummy block among the gate blocks, and a plurality of link lines configured to connect the gate blocks to the pixel rows, at least one of the link lines being multi-segmented to include a plurality of segments oriented in different directions in plan view.

In another aspect, there is provided a display panel including a non-rectangular portion divided into at least a first area and a second area, including: a non-rectangular portion including: a first area, and a second area, 'x'-numbered gate lines in the first area, and 'y'-numbered gate lines in the second area, where x>y, and each of 'x' and 'y' is an integer), a gate driver configured to transmit respective gate signals to the gate lines, a dummy block in the second area, the dummy block being adjacent to the first area, and a plurality of link lines, each configured to connect the gate driver to a corresponding one of the gate lines.

In another aspect, there is provided a display panel, including: a display area including a plurality of pixels, a circuit area including a gate driver, and a bezel including a plurality of link lines configured to connect the gate driver to the plurality of pixels, wherein the display panel is divided into a rectangular portion and a non-rectangular portion, wherein a first link line, among the plurality of link lines, in the rectangular portion is a single segment, wherein a second link line, among the plurality of link lines, in the non-rectangular portion includes a multi-segmented line including a plurality of sub-link lines oriented in different directions in plan view, and wherein the non-rectangular portion includes a plurality of dummy gate drivers.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
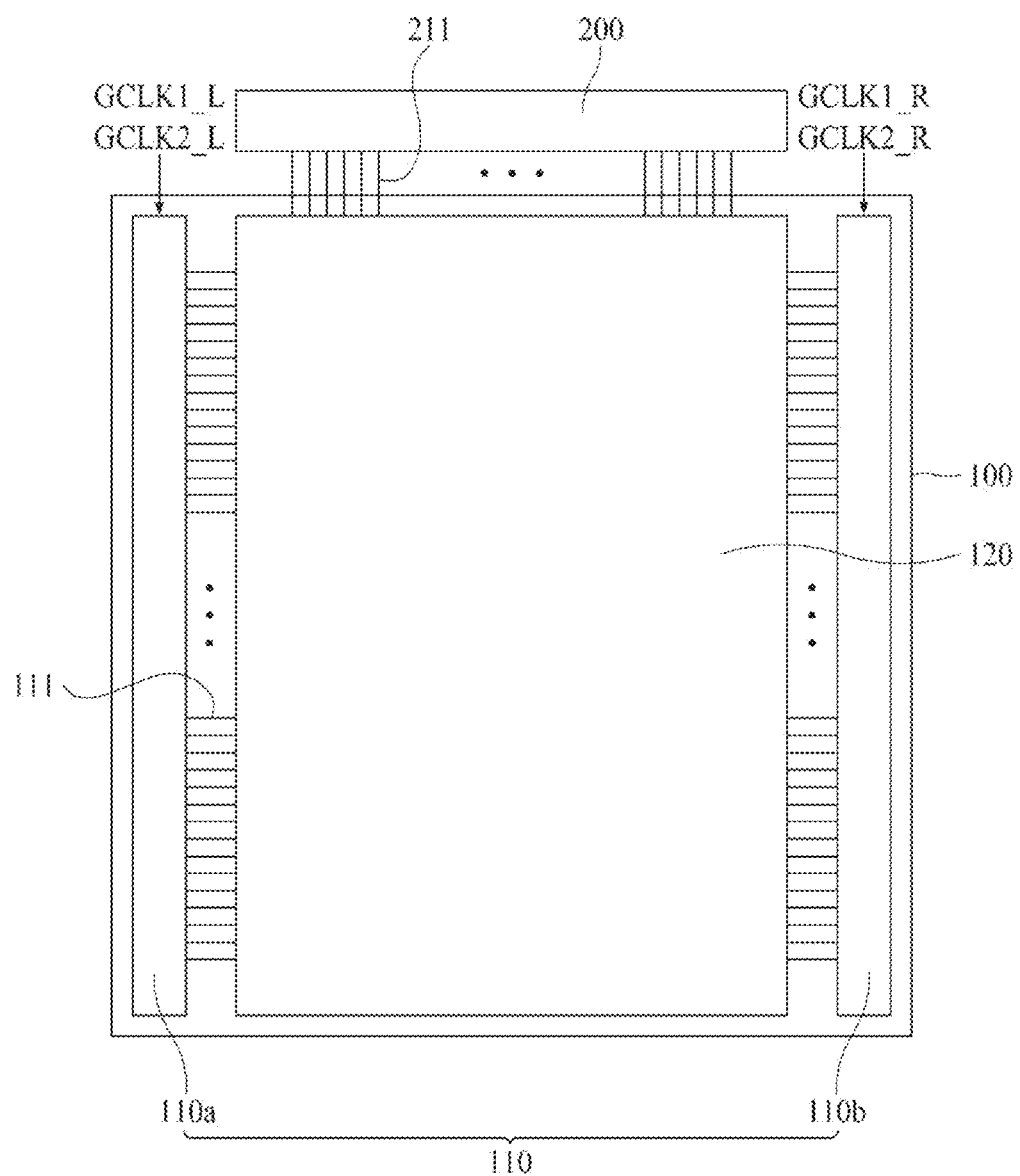
FIG. 1 illustrates a display panel according to an example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. May be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally. For a display panel with a display area (and/or a non-display area) that defines a certain two-dimensional area, the plan view may be from an orientation in a third dimension perpendicular to the display area (and/or the non-display area) and may comprise a cross-section through the display panel.

Features of various embodiments of the present disclosure may be partially or overall coupled to or combined to each other, and may be variously inter-operated to each other and driven technically as those skilled in the art can sufficiently understand. Embodiments of the present disclosure may be carried out independently from each other, or may be carried out together in co-dependent relationship.

The display panel according to example embodiments of the present disclosure may be embodied in a liquid crystal display panel, a field emission display panel, an organic light-emitting display panel, a quantum dot display panel, etc. As described above, when a gate driver is embedded inside a display panel, the gate driver occupies some area of a non-display area so that a size of the non-display area is increased. To decrease the size of the non-display area, the occupied area of the gate driver may be decreased by an optimized layout of the gate driver, or by optimizing a design of a link line configured to connect the gate driver and a pixel array to each other. Hereinafter, optimizing the design of the link line will be described with reference to the present disclosure.

A gate driver may include a shift register including a plurality of stages connected dependently, and the plurality of stages may be respectively connected to a pixel array. A non-rectangular display panel may be manufactured with a curved line having a certain curvature in at least some area thereof. A non-rectangular display panel may be applied to a circle-shaped display panel or a shape having an angle other than a right angle (90°). A non-rectangular display may also include displays that is capable of being folded, rolled, or bent. A non-rectangular display panel may include a curved line (e.g., boundary) so that the gate driver embedded in a non-rectangular portion of the display panel may be arranged along the curved line. Thus, the plurality of stages arranged in the non-rectangular portion may not be respectively positioned on the same axis as the pixel array connected to the plurality of stages. A link line, configured to connect the gate driver and the pixel array to each other, may be bent or inclined along the curved line. For example, if some area may be wasted due to the non-optimized arrangement of the link line or if the link line is designed to increase the size of the non-display area, the non-display area of the display panel may be increased in size. Therefore, present inventors have recognized the above-described problems and have invented a structure of a link line that facilitates a decrease in a size of a non-display area, and more particularly, a size of a non-display area in a non-rectangular portion, and a display panel using the same.

Hereinafter, a display panel including link lines according to an embodiment of the present disclosure will be described in detail with reference to the accompanying drawings.

FIG. 1 illustrates a display panel according to an example embodiment of the present disclosure.

With reference to FIG. 1, the display panel 100 may be divided into a pixel area 120, and a remaining area, other than the pixel area 120. The pixel area 120 may include a pixel array, including pixel rows, and may display an image, which may be referred to as a "display area." In the display panel 100, the remaining area, other than the pixel area 120, may correspond to a non-display area in which a gate driver 110 for applying a signal to pixels, various lines, and pads may be arranged. In FIG. 1, a data driver 200 may be outside of the display panel 100, however, a position of the data driver 200 is not limited thereto.

The data driver 200 may output a data signal in response to a data timing control signal supplied from a timing controller. The data driver 200 may sample and latch a digital-type data signal supplied from the timing controller, and may then convert the digital-type data signal into an analog-type data signal based on a gamma reference voltage. The output data signal may be provided to a data line in the pixel area 120 through a data link line 211. For example, the data driver 200 may be provided as an integrated circuit (IC) type or as a chip-on-glass (COG) type on the display panel 100, or may be provided as a chip-on-film (COF) type in the display panel 100. Also, the timing controller may be integrated or combined with the data driver 200, and thus, may be embodied as a one-chip type, depending on the product.

The gate driver 110 may output a gate signal in response to a gate timing control signal supplied from the timing controller. For example, the gate timing control signal may include a gate clock signal (GCLK1_L, GCLK2_L, GCLK1_R, GCLK2_R), a start signal, etc. The gate driver 110 may provide the gate signal to a gate line in the pixel area 120 through a gate link line 111. The gate driver 110 may be provided an integrated circuit (IC) type. However, the gate driver 110 may be provided as a gate-in-panel (GIP) type embedded or provided in the display panel 100. The gate driver 110 may be in left and right areas of the display panel 100, or may be in any one of the left and right areas of the display panel 100. For example, the gate driver 110 may include a first gate driver 110a (or left-sided gate driver) in the left area of the display panel 100, and a second gate driver 110b (or right-sided gate driver) in the right area of the display panel 100. As described above, the display panel 100 may display an image in accordance with the gate signal supplied from the gate driver 110, the data signal supplied from the data driver 200, and a power voltage supplied from a power supply portion.

Figure 2:
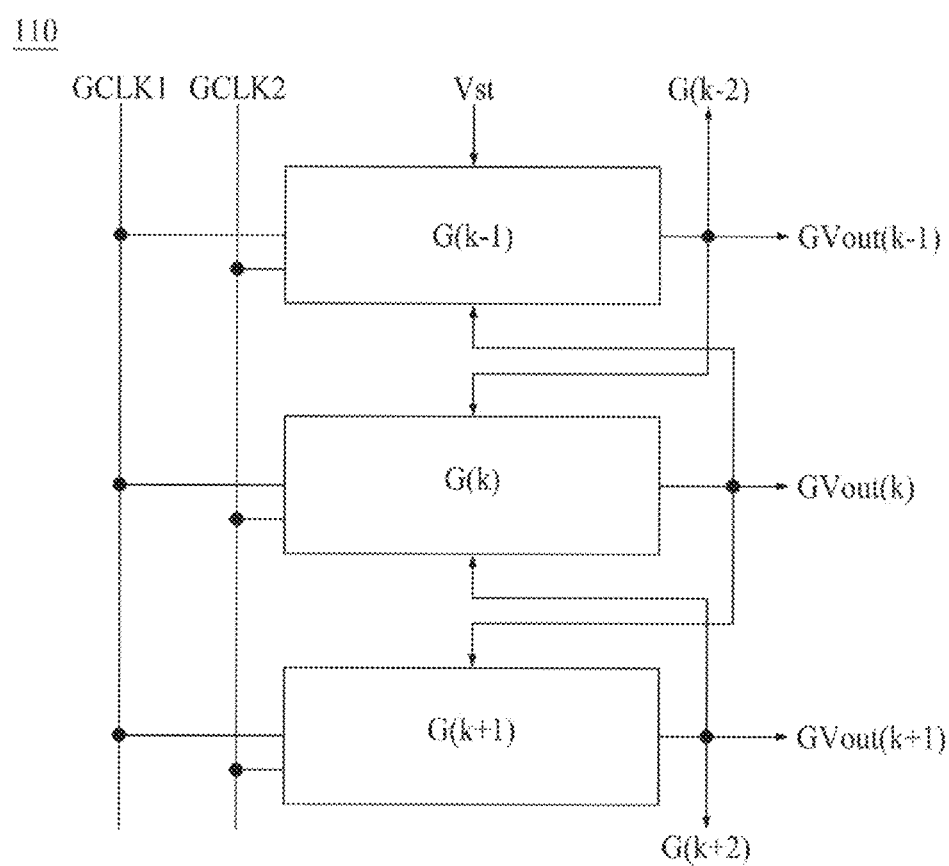
FIG. 2 illustrates a structure of gate stages included in a gate driver according to an example embodiment of the present disclosure.

FIG. 2 illustrates a structure of gate stages included in a gate driver according to an example embodiment of the present disclosure.

With reference to FIGS. 1 and 2, the gate driver 110 may include a shift register. The shift register may include gate stages (G(k−1), G(k), G(k+1)) dependently connected as shown in FIG. 2. The gate stages (G(k−1), G(k), G(k+1)) may start to output the gate signal in response to the start signal (Vst), and may shift the output in accordance with the gate clock signal (GCLK1, GCLK2). The gate stages (G(k−1), G(k), G(k+1)) may be connected to the gate link lines. Output signals (GVout(k−1), GVout(k), GVout(k+1)) of the gate stages (G(k−1), G(k), G(k+1)) may be the gate signals, and may be supplied to the gate lines (GL1 to GLn) of the pixel area 120. The output signal of each of the gate stages (G(k−1), G(k), G(k+1)) may be provided to the next gate stage as the start signal. Also, the output signal of each of the gate stages (G(k−1), G(k), G(k+1)) may be provided to the previous gate stage (e.g., from G(k−1) to G(k−2)) as a reset signal. The gate stages (G(k−1), G(k), G(k+1)) may output an additional carry signal in addition to the gate signal, and may supply the carry signal, which may serve as the start signal, to another stage (e.g., from G(k+1) to G(k+2)). FIG. 2 shows an example in which the $(k-1)^{th}$ gate stage (G(k−1)), the $k^{th}$ gate stage (G(k)), and the $(k+1)^{th}$ gate stage (G(k+1)). For example, 'k' is an integer satisfying $2 \leq k < (n-1)$.

Connection lines among the gate stages (G(k−1), G(k), G(k+1)) may transmit the start signal (Vst), the gate clock signal (GCLK1, GCLK2), and the driving voltage as the carry signal and the reset signal among the gate stages (G(k−1), G(k), G(k+1)). The driving voltage may include a high voltage and a low voltage of the gate signal. The carry signal may be input as the start signal of the next gate stage, and the reset signal may discharge the output of the previous gate stage.

The gate driver 110 may include a scan driver and an emission driver. The scan driver may provide a scan signal to the gate line, and the emission driver may provide an emission signal (or emission control signal) to the gate line. The gate line may include a scan line supplied with the scan signal, and an emission line supplied with the emission signal. Each of the scan driver and the emission driver may be realized in a structure of the gate stages as described in the FIG. 2 example. Also, the gate driver 110 may include a reference voltage driver in accordance with the type of pixel driving circuit included in the pixel. The reference voltage driver may provide a reference voltage to a reference voltage line.

Figure 3:
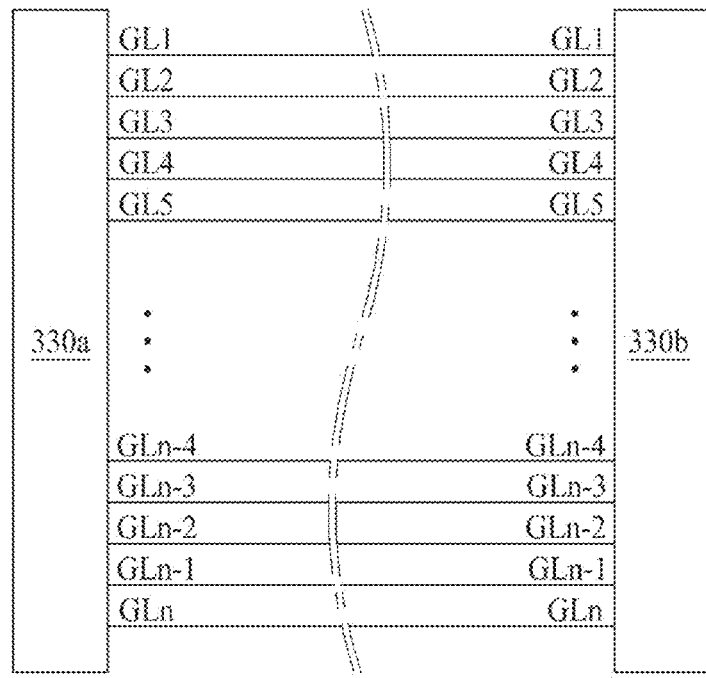
FIGS. 3 and 4 illustrate various connection types between a gate driver and a gate line according to example embodiments of the present disclosure.
Figure 4:
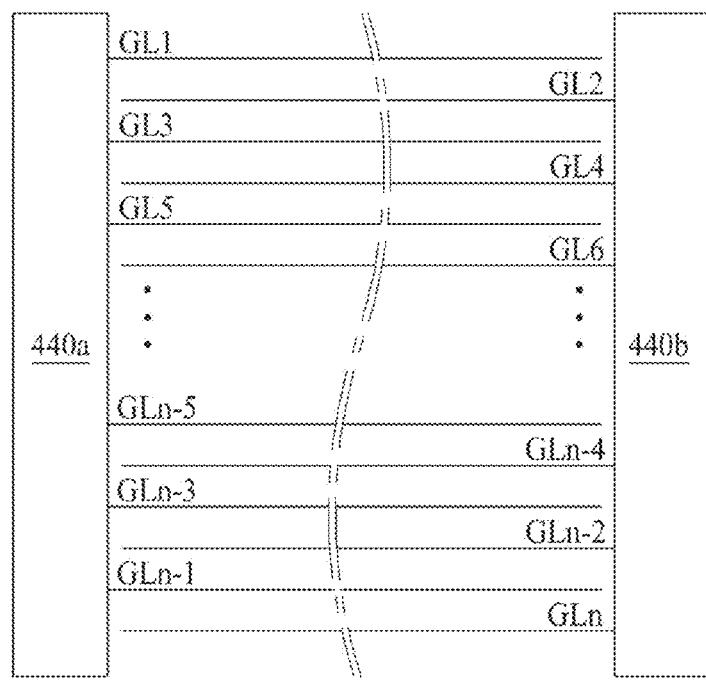

FIGS. 3 and 4 illustrate various connection types between a gate driver and a gate line according to example embodiments of the present disclosure.

With reference to FIG. 3, the gate driver may include a first gate driver 330a at one edge area (e.g., a left side) of the display panel 100, and a second gate driver 330b at the other edge area (e.g., a right side) of the display panel 100. It should be appreciated that "left" and "right" are used herein for convenience of description to provide a view or a frame of reference, and are interchangeable, and positions are not limited thereto. Each of the first gate driver 330a and the second gate driver 330b may be connected to the gate lines (GL1 to GLn) connected to all pixel rows arranged in the pixel area 120.

The first gate driver 330a and the second gate driver 330b may receive the start signal (Vst) at the same time, and may output the gate signal at the same time. Thus, the gate signals, which may be output from the first gate driver 330a and the second gate driver 330b, may be applied to both ends of the gate line at the same time. For example, when the pixels of the pixel area 120 are equally divided in half, e.g., are divided into the two areas corresponding to the left-sided and right-sided areas, the first gate driver 330*a* may apply the gate signal to the pixels in the left-sided area, and the second gate driver 330*b* may apply the gate signal to the pixels in the right-sided area. Accordingly, it may be possible to drive the pixels by rapidly applying the gate signal to the pixels in the high-resolution display panel.

With reference to FIG. 4, a first gate driver 440*a* may be connected to the gate lines included in a first group, and may sequentially supply the gate signal to the gate lines of the first group. A second gate driver 440*b* may be connected to the gate lines included in a second group, and may sequentially supply the gate signal to the gate lines of the second group.

The gate lines of the first group may be odd-numbered gate lines (e.g., GL1, GL3, . . . , GLn−1). The gate lines of the second group may be even-numbered gate lines (e.g., GL2, GL4, . . . , GLn). For example, the start signal (Vst) may be applied with the time difference to each of the first gate driver 440*a* and the second gate driver 440*b*. Thus, there may be a time difference between the output timing of the gate signal and the output timing of the carry signal to the first gate driver 440*a*, and between the output timing of the gate signal and the output timing of the carry signal to the second gate driver 440*b*. For example, after the first gate signal is applied to the first gate line (GL1) from the first gate driver 440*a*, the second gate signal may be supplied from the second gate driver 440*b* to the second gate line (GL2) after about one horizontal period. This design structure of arranging the first gate driver 440*a* and the second gate driver 440*b* in the respective left-sided and right-sided areas of the display panel may secure available space in the arrangement so that a layout of the gate driver may be changed in various devices.

Figure 5:
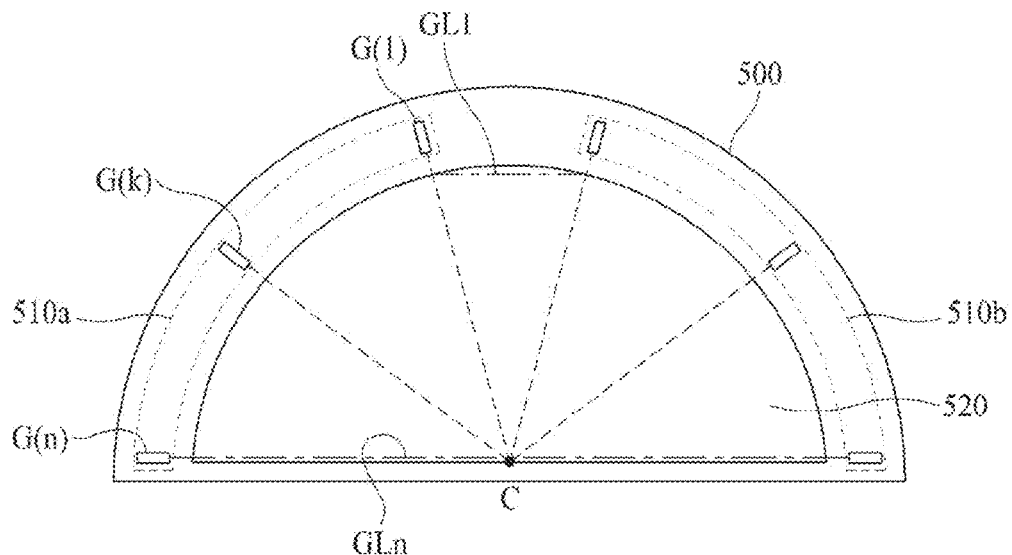
FIGS. 5 and 6 illustrate various examples of a display panel including a curved line (e.g., boundary) according to embodiments of the present disclosure.
Figure 6:
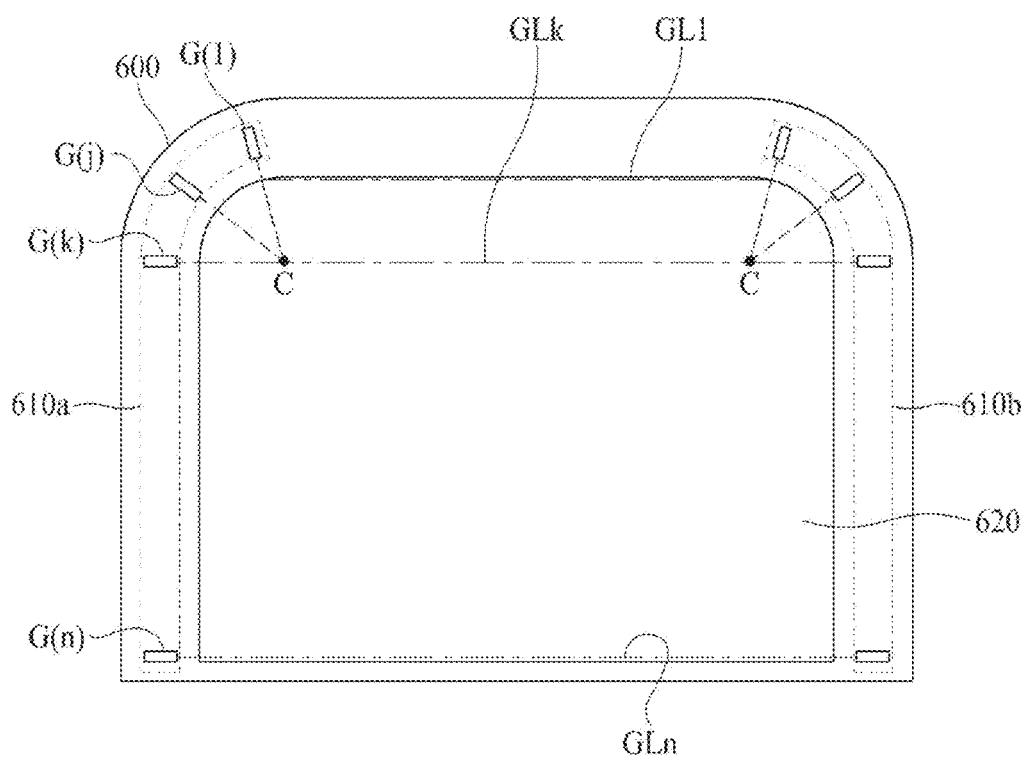

FIGS. 5 and 6 illustrate various examples of a display panel including a curved line (e.g., boundary) according to embodiments of the present disclosure.

With reference to FIGS. 5 and 6, a display panel 500 and 600, including a curved line, may be referred to as a "deformed display panel" or a "non-rectangular display panel." The non-rectangular display panel may be manufactured with a curved line having a certain curvature in at least some area thereof. The display panel 500 and 600 may be divided into a non-rectangular portion, which may have a curved-line portion, and a rectangular portion that may not have a curved line. A non-rectangular display may also include displays that is capable of being folded, rolled, or bent. The example of FIG. 5 shows the display panel 500 having only the non-rectangular portion, which is shown as a semi-circle shape, but it may be applied to a circle-shaped display panel or a shape having an angle other than a right angle (90°). The example of FIG. 6 shows the display panel 600 including both the non-rectangular portion and the rectangular portion, and the non-rectangular portion is formed in the left upper portion (or left upper corner portion) and the right upper portion (or right upper corner portion) of the display panel 600. However, the non-rectangular portion may be applied to the left lower portion (or left lower corner portion) and the right lower portion (or right lower corner portion) of the display panel 600.

With further reference to FIG. 5, the display panel 500 may be divided into a pixel area 520 provided with pixels and gate lines (GL1, . . . , GLn), and a non-display area provided with gate drivers 510*a* and 510*b* and other lines. The non-display area may correspond to the remaining area other than the pixel area 520. In the non-display area, gate stages (G(1), . . . , G(k), . . . , G(n)) of the gate driver 510*a* and 510*b* may be arranged along the curved line of the display panel 500. The gate stages (G(1), . . . , G(k), . . . , G(n)) may be arranged at fixed intervals in a radial shape on a line extended from the center (C) of the circle. The center of the short-axis length of the gate stages (G(1), . . . , G(k), . . . , G(n)) may meet with the line extended from the center (C) of the circle. The first gate stage (G(1)) and the n$^{th}$ gate stage (G(n)) may be respectively positioned on the extended line obtained by connecting one end of the first gate line (GL1) to the center (C) of the circle, and the extended line obtained by connecting one end of the n$^{th}$ gate line (GLn) to the center (C) of the circle. For example, the connection line obtained by connecting the centers of the short-axis lengths of the gate stages (G(1), . . . , G(k), . . . , G(n)) may have a concentric circle shape with respect to the center (C) of the circle.

With further reference to FIG. 6, the display panel 600 may be divided into a pixel area 620 provided with pixels and gate lines (GL1, . . . , GLk, . . . , GLn), and the remaining area other the pixel area 620, which may be provided with gate drivers 610*a* and 610*b* and other lines. Also, the display panel 600 may include the non-rectangular portion and the rectangular portion.

The gate lines from the first gate line (GL1) to the k$^{th}$ gate line (GLk) may be provided in the non-rectangular portion. Gate stages (G(1), . . . , G(j), . . . , G(k)) of the gate drivers 610*a* and 610*b* may be arranged along a curved line of the display panel 600 in the non-display area other than the pixel area 620. The gate stages (G(1), . . . , G(j), . . . , G(k)) may be arranged at fixed intervals in a radial shape on a line extended from the center (C) of the circle. The center of the short-axis length of the gate stages (G(1), . . . , G(j), . . . , G(k)) may meet with the line extended from the center (C) of the circle. The first gate stage (G(1)) and the k$^{th}$ gate stage (G(k)) may be respectively positioned on the extended line obtained by connecting one end of the first gate line (GL1) to the center (C) of the circle, and the extended line obtained by connecting one end of the k$^{th}$ gate line (GLk) to the center (C) of the circle. For example, the connection line obtained by connecting the centers of the short-axis lengths of the gate stages (G(1), . . . , G(j), . . . , G(k)) may have a concentric circle shape with respect to the center (C) of the circle.

The gate lines from the (k+1)$^{th}$ gate line to the n$^{th}$ gate line (GLn) may be provided in the rectangular portion. Gate stages (G(k+1), . . . , G(n)) of the gate drivers 610*a* and 610*b* may be arranged along a straight line of the display panel in the non-display area. The gate stages (G(k+1), . . . , G(n)) may be arranged on the extended line of the gate lines (GLk+1, . . . , GLn).

Figure 7:
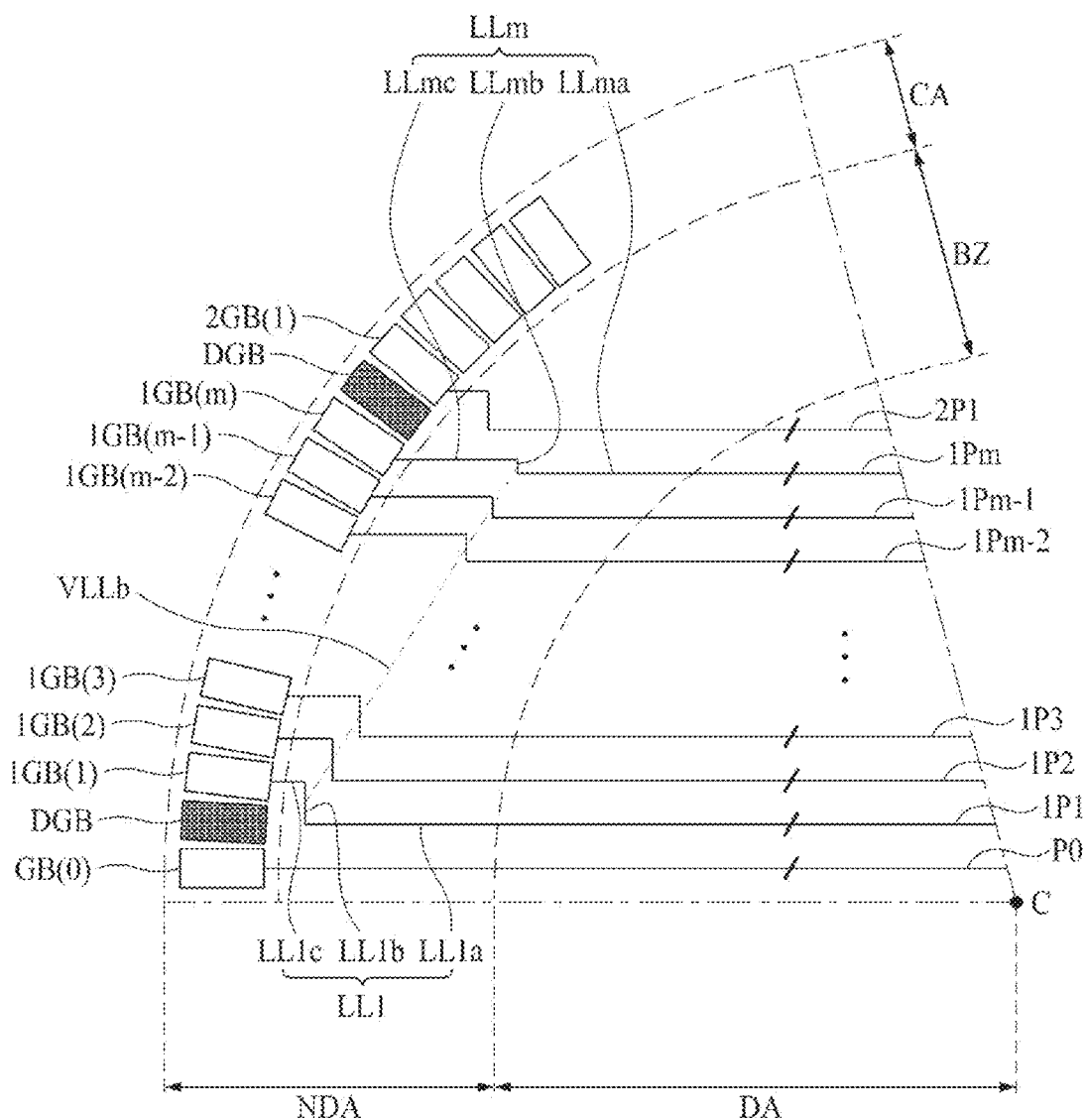
FIG. 7 is an enlarged view illustrating an example embodiment of a curved-line portion in the example display panels of FIGS. 5-6.

FIG. 7 is an enlarged view illustrating an example embodiment of a curved-line portion in the example display panels of FIGS. 5-6.

FIG. 7 shows the non-rectangular portion of the curved line in the left upper portion of the display panel. The display panel may be divided into a display area (DA), and a non-display area (NDA) in the periphery of the display area (DA). The non-display area (NDA) may be divided into a circuit area (CA) including a gate driver configured to apply a signal to a gate line of the display area (DA), and a bezel (BZ) including a link line configured to connect the gate driver and the gate line to each other.

A plurality of pixels in the display area (DA) may form a plurality of pixel rows. The number of pixels in each of the plurality of pixel rows may be gradually decreased as it goes from a lower portion of the display panel toward an upper portion of the display panel.

With reference to FIG. 7, the non-rectangular portion may include 'm' pixel rows, and the plurality of pixels may be arranged in each of the 'm' pixel rows. As a length of the display area (DA) in which '1P1' is arranged may be larger than a length of the display area (DA) in which '1Pm' is arranged, the number of pixels arranged in '1P1' may be larger than the number of pixels arranged in '1Pm'. For example, '1Pm' may be a group of the gate lines connected to the pixels included in one pixel row, or may be a group of the gate lines connected to two pixel rows. If desired, '1Pm' may be a group of the gate lines connected to the pixels included in three or more pixel rows. Hereinafter, '1Pm' is referred to as the "$m^{th}$ gate line group." Accordingly, the non-rectangular portion may include the gate line groups from the first gate line group (1P1) to the $m^{th}$ gate line group (1Pm), and there may be gate line groups whose identification number is less than 'm' above the $m^{th}$ gate line group (1Pm). For example, when the non-rectangular portion is divided into two areas of first and second areas, the first area may include the gate line groups from the first gate line group (1P1) to the $m^{th}$ gate line group (1Pm), and the second area may correspond to the area above the first area, such that the second area may include the gate line groups from the first gate line group (2P1) of the second area to the $r^{th}$ gate line group (2Pr) of the second area. For example, 'm>r', and each of 'm' and 'r' is an integer. The described example shows that the non-rectangular portion is divided into two areas. However, it may be possible to divide the non-rectangular portion into three or more areas.

The gate driver that provides the signal to one gate line group may be defined as a gate block. The gate block may include the plurality of gate stages, and the plurality of gate blocks may constitute the gate driver. As described above with reference to FIGS. 5 and 6, the aforementioned gate stages (G(1), G(j), G(k), G(n)) may be embodied in type of the gate block.

The gate line connected to the pixels included in one pixel row may include a scan line, an emission line, and reference voltage lines, as described above. For example, the gate line group connected to the pixels included in one pixel row may include five lines of a first scan line, a second scan line, an emission line, a reference voltage line, and an initial voltage line. When the $m^{th}$ gate line group (1Pm) corresponds to the group of the gate lines connected to the pixels included in the two pixel rows, the $m^{th}$ gate line group (1Pm) may include ten gate lines. For example, the number of gate lines included in the gate line group and the number of link lines for connecting the gate block with the gate line group may correspond to a multiple of 'm'. For example, a pixel driving circuit for providing the signal to the pixel may be an internal compensating circuit such as "7T1C" or "8T1C." In "7T1C" or "8T1C," 'T' indicates a thin film transistor, and 'C' indicates a capacitor, including, respectively, seven transistors and one capacitor for "7T1C" or eight transistors and one capacitor "8T1C."

The circuit area (CA) may correspond to the area in which the gate driver for providing the gate signal to the pixels may be positioned. As described above, the plurality of gate stages may be arranged along the curved line. In FIG. 7, the plurality of gate stages may be expressed as the "gate block," and may be connected to the gate line groups. As one gate signal is output to one gate stage, the gate block may include the plurality of gate stages. Each of the gate blocks (1GB(1), 1GB(2), 1GB(3), . . . , 1GB(m−2), 1GB(m−1), 1GB(m)) may be connected to each of the gate line groups (1P1, 1P2, 1P3, . . . , 1Pm), and each of the gate blocks (1GB(1), 1GB(2), 1GB(3), . . . , 1GB(m−2), 1GB(m−1), 1GB(m)) may provide the gate signal to the pixels connected to the gate line groups (1P1, 1P2, 1P3, . . . , 1Pm−2, 1Pm−1, 1Pm). For example, when the gate line group is the group of the gate lines connected to the pixels included in the two pixel rows, one gate block may provide the gate signal to the gate lines connected to the pixels included in the two pixel rows.

The bezel (BZ) may correspond to the area between the display area (DA) and the circuit area (CA), and the link lines for connecting the gate block with the gate line group may be provided in the bezel (BZ). The link lines (or the 'm'-numbered link lines) may be formed of the extended lines of the gate lines, and the link lines (or each of the 'm'-numbered link lines) may include the first sub-link line, the second sub-link line, and the third sub-link line. The first link line (LL1) for connecting the first gate line group (1P1) and the first gate block (1GB(1)) to each other may include the first sub-link line (LL1a), the second sub-link line (LL1b), and the third sub-link line (LL1c), and the $m^{th}$ link line (LLm) for connecting the $m^{th}$ gate line group (1Pm) and the $m^{th}$ gate block (1GB(m)) to each other may include the first sub-link line (LLma), the second sub-link line (LLmb), and the third sub-link line (LLmc).

The $0^{th}$ gate line group (P0) positioned below the first gate line group (1P1) may be included in the rectangular portion of the display panel, and the link line connected to the $0^{th}$ gate block (GB(0)) may have a straight-line shape. For example, the gate line groups positioned above the $0^{th}$ gate line group (P0) connected to the link line provided with the extended line of the gate line and including the straight line without any bent portion may be included in the non-rectangular portion, and they may be referred as the "first gate line group (1P1)." The first gate line group (1P1) may not be connected to the gate block adjacent to the $0^{th}$ gate block (GB(0)), but may be connected to the first gate block (1GB(1)) corresponding to the next gate block. Thus, there may be a dummy gate block (DGB) between the $0^{th}$ gate block (GB(0)) and the first gate block (1GB(1)), which may not be connected to the gate line groups. The dummy gate block (DGB) may be referred to as a "dummy block" or "dummy gate driver," but the term is not limited thereto. Thus, as the first gate block (1GB(1)) may not be positioned on the extended line of the first gate line group (1P1) due to the dummy gate block (DGB), the first link line (LL1), for connecting the first gate line group (1P1) to the first gate block (1GB(1)), may be designed to include the bent point (or bent portion). When the link lines (LL1, . . . , LLm) included in the non-rectangular portion are formed in the straight-line shape without any bent point, the link lines may be concentrated in the area adjacent to the display area (DA), and a short may occur between each of the link lines in the area adjacent to the display area (DA) in accordance with resolution of the display panel and an interval between each of the link lines. When the link lines (LL1, . . . , LLm) included in the non-rectangular portion include the bent point, it may be possible to avoid or prevent the short between each of the link lines and to decrease the size (e.g., the width) of bezel (BZ).

Each of the link lines (LL1, . . . , LLm) may include the first sub-link line (LL1a, . . . , LLma), the second sub-link line (LL1b, . . . , LLmb), and the third sub-link line (LL1c, LLmc). The first sub-link line (LL1a, . . . , LLma) may connect the gate line group (1P1, . . . , 1Pm) to the second sub-link line (LL1b, . . . , LLmb), the second sub-link line (LL1b, . . . , LLmb) may connect the first sub-link line (LL1a, . . . , LLma) to the third sub-link line (LL1c, . . . , LLmc), and the third sub-link line (LL1c, . . . , LLmc) may connect the second sub-link line (LL1b, . . . , LLmb) to the gate block (1GB(1), . . . , 1GB(m)). The first sub-link line (LL1a, . . . , LLma) and the second sub-link line (LL1b, . . . , LLmb) may be at right angle, and the second sub-link line (LL1b, . . . , LLmb) and the third sub-link line (LL1c, . . . , LLmc) may be at right angle. The first sub-link lines (LL1a, . . . , LLma) may be parallel to one another, the second sub-link lines (LL1b, . . . , LLmb) may be parallel to one another, and the third sub-link lines (LL1c, . . . , LLmc) may be parallel to one another. For example, a virtual line (VLLb), obtained by connecting the centers of the second sub-link lines (LL1b, . . . , LLmb), may be formed in a direction in which the size of the bezel (BZ) may not be increased. For example, an angle between the gate line and the virtual line obtained by connecting the centers of the second sub-link lines (LL1b, . . . , LLmb) may be an acute angle. For example, when it is presumed that a crossing point between the first sub-link line (LL1a, . . . , LLma) and the second sub-link line (LL1b, . . . , LLmb) is referred to as a "first bent point," and a crossing point between the second sub-link line (LL1b, . . . , LLmb) and the third sub-link line (LL1c, . . . , LLmc) is referred to as a "second bent point," a virtual line obtained by connecting the first bent points or second bent points may be formed in a direction in which the size of the bezel (BZ) may not be increased, and an angle between the gate line and the virtual line obtained by connecting the first bent points or second bent points may be an acute angle. When the dummy gate block (DGB) is between the $0^{th}$ gate block (GB(0)) and the first gate block (1GB(1)), a virtual line (VLLb) obtained by connecting the centers of the second sub-link lines (LL1b, . . . , LLmb) may be formed in a direction in which the size of the bezel (BZ) may not be increased. When an angle between the gate line and the virtual line (VLLb) obtained by connecting the centers of the second sub-link lines (LL1b, . . . , LLmb) is obtuse, the virtual line obtained by connecting the centers of the second sub-link lines (LL1b, . . . , LLmb) may be formed in a direction in which the size of the bezel (BZ) may be increased, and the size of the bezel (BZ) may also be increased virtually. Thus, when the dummy gate block (DGB) is positioned on the boundaries between the non-rectangular portion and the rectangular portion of the display panel, the link lines included in the non-rectangular portion may include the bent point, and the angle between the gate line and the virtual line obtained by connecting the centers of the second sub-link lines (LL1b, . . . , LLmb) may be acute, which may decrease the size of the bezel (BZ).

The length of the second sub-link line (LL1b, . . . , LLmb) for connecting the $m^{th}$ gate block (1GB(m)) to the last gate line (the uppermost gate line) of the $m^{th}$ gate line group (1Pm) may be short, e.g., 0 or close to 0 units. For example, the first gate line group (2P1) positioned above the $m^{th}$ gate line group (1Pm) and included in the second area may not be connected to the gate block adjacent to the $m^{th}$ gate block (1GB(m)), but may be connected to the first gate block (2GB(1)) corresponding to the next gate block. Thus, the dummy gate block (DGB), which may not be connected to the gate line group, may be between the $m^{th}$ gate block (1GB(m)) of the first area and the first gate block (2GB(1)) of the second area. Due to the dummy gate block (DGB), the first gate block (2GB(1)) may not be positioned on the extended line of the first gate line group (2P1) of the second area, so that the link line for connecting the first gate line group (2P1) of the second area with the first gate block (1GB(1)) may include the bent point. In a similar manner, the link lines for connecting the gate blocks with the gate line groups positioned above the first gate line group (2P1) in the second area may include the second sub-link line, and the angle between the gate line and the virtual line obtained by connecting the centers of the second sub-link lines may be acute, and it may be possible to decrease the size of the bezel (BZ). For example, the angle between the gate line and the virtual line obtained by the centers of the second sub-link lines in the second area may be different from the angle between the gate line and the virtual line (VLLb) obtained by connecting the centers of the second sub-link lines in the first area. For example, the angle between the gate line and the virtual line obtained by connecting the centers of the second sub-link lines in the second area may be smaller than the angle between the gate line and the virtual line (VLLb) obtained by connecting the centers of the second sub-link lines in the first area. Thus, the angle between the gate line and the virtual line obtained by connecting the centers of the second sub-link lines may be acute, and it may be possible to decrease the size of the non-display area (NDA) of the display panel.

Figure 8:
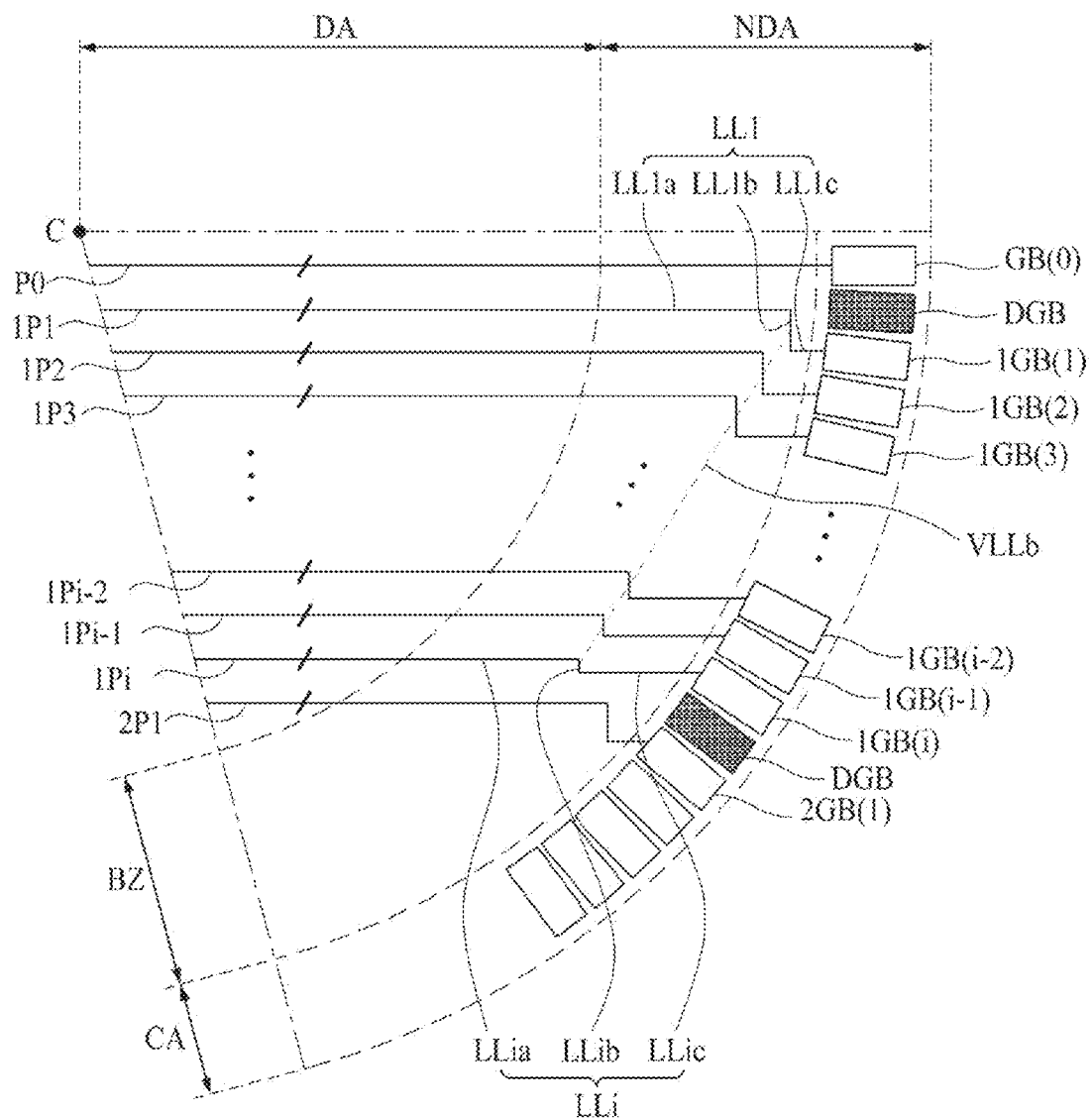
FIG. 8 illustrates an example in which a curved-line portion is positioned in a lower portion of a display panel according to an embodiment of the present disclosure.

FIG. 8 illustrates an example in which a curved-line portion is positioned in a lower portion of a display panel according to an embodiment of the present disclosure.

A repetitive description for the same parts as those of FIG. 7 will be shown in brief, or will be omitted. FIG. 8 shows an example of the non-rectangular portion of the curved line in the left lower portion of the display panel. The display panel may be divided into a display area (DA) provided with pixels, and a non-display area (NDA) in the periphery of the display area (DA). The non-display area (NDA) may be divided into a circuit area (CA) including a gate driver configured to apply a signal to a gate line of the display area (DA), and a bezel (BZ) including a link line configured to connect the gate driver and the gate line to each other.

In FIGS. 7 and 8, the curved line showing each of the display area (DA), the bezel (BZ), and the circuit area (CA) is shown as the curved line having the same curvature with respect to the center (C) of the circle. However, the curvature of the curved line for defining the display area (DA) may be different from the curvature of the curved line for defining each of the bezel (BZ) and the circuit area (CA), and the size of the bezel (BZ) formed in the non-rectangular portion may not be constant. Also, because the curvature of the curved line showing the circuit area (CA) of FIG. 7 is different from the curvature of the curved line showing the circuit area (CA) of FIG. 8, FIG. 8 explains a case in which 'i' pixel rows are provided in the non-rectangular portion of the display panel. For example, each of 'i' and 'm' is an integer, 'i' is different from 'm', and each of 'i' and 'm' is smaller than 'n'.

The number of pixels in each of the plurality of pixel rows in the non-rectangular portion may be gradually decreased toward the lower portion of the display panel. The non-rectangular portion may include 'i' pixel rows, and the plurality of pixels may be in the 'i' pixel rows. As a length of the display area (DA) in which the first gate line group (1P1) of the first area is arranged may be larger than a length of the display area (DA) in which the $i^{th}$ gate line group (1Pi) is arranged, the number of pixels arranged in the first gate line group (1P1) may be larger than the number of pixels arranged in the $i^{th}$ gate line group (1Pi). The non-rectangular portion of FIG. 8 may include the gate line groups from the first gate line group (1P1) to the $i^{th}$ gate line group (1Pi), and the gate line groups having an identification number less than that of each of the first gate line group (2P1) to the $i^{th}$ gate line group may be included in the second area below the $i^{th}$ gate line group (1Pi).

The circuit area (CA) may correspond to the area in which the gate driver for providing the gate signal to the pixels may be positioned. As described above, the plurality of gate stages may be arranged along the curved line. In a similar manner as in FIG. 7, in the example of FIG. 8, plurality of gate stages may be expressed as the "gate block," and may be connected to the gate line groups. As each of the gate blocks (1GB(1), 1GB(2), 1GB(3), . . . , 1GB(i-2), 1GB(i-1), 1GB(i)) may be connected to each of the gate line groups (1P1, 1P2, 1P3, . . . , 1Pi-2, 1Pi-1, 1Pi), each of the gate blocks (1GB(1), 1GB(2), 1GB(3), . . . , 1GB(i-2), 1GB(i-1), 1GB(i)) may provide the gate signal to the pixels connected to the gate line groups (1P1, 1P2, 1P3, . . . , 1Pi-2, 1Pi-1, 1Pi).

The bezel (BZ) may correspond to the area between the display area (DA) and the circuit area (CA), and the link lines for connecting the gate block with the gate line group may be in the bezel (BZ). The link lines may include the extended lines of the gate lines, and each of the link lines may include the first sub-link line, the second sub-link line, and the third sub-link line. The first link line (LL1) for connecting the first gate line group (1P1) and the first gate block (1GB(1)) to each other may include the first sub-link line (LL1a), the second sub-link line (LL1b), and the third sub-link line (LL1c), and the $i^{th}$ link line (LLi) for connecting the $i^{th}$ gate line group (1Pi) and the $i^{th}$ gate block (1GB(i)) to each other may include the first sub-link line (LLia), the second sub-link line (LLib), and the third sub-link line (LLic).

The $0^{th}$ gate line group (P0) positioned above the first gate line group (1P1) may be included in the rectangular portion of the display panel, and the link line connected to the $0^{th}$ gate block (GB(0)) may have a straight-line shape. For example, the gate line groups positioned below the $0^{th}$ gate line group (P0) connected to the link line of the extended line of the gate line, and including the straight line without any bent portion, may be included in the non-rectangular portion. The first gate line group (1P1) may not be connected to the gate block adjacent to the $0^{th}$ gate block (GB(0)), but may be connected to the first gate block (1GB(1)) corresponding to the next gate block. Thus, there may be a dummy gate block (DGB) between the $0^{th}$ gate block (GB(0)) and the first gate block (1GB(1)), and which may not be connected to the gate line groups. Thus, as the first gate block (1GB(1)) may not be positioned on the extended line of the first gate line group (1P1) due to the dummy gate block (DGB), the first link line (LL1) for connecting the first gate line group (1P1) and the first gate block (1GB(1)) to each other may be designed to include the bent point.

Each of the link lines (LL1, . . . , LLi) may include the first sub-link line (LL1a, . . . , LLia), the second sub-link line (LL1b, . . . , LLib), and the third sub-link line (LL1c, LLic). The first sub-link line (LL1a, . . . , LLia) may connect the gate line group (1P1, 1Pi) to the second sub-link line (LL1b, . . . , LLib), the second sub-link line (LL1b, . . . , LLib) may connect the first sub-link line (LL1a, . . . , LLia) to the third sub-link line (LL1c, . . . , LLic), and the third sub-link line (LL1c, . . . , LLic) may connect the second sub-link line (LL1b, . . . , LLib) to the gate block (1GB(1), . . . , 1GB(i)). The first sub-link line (LL1a, . . . , LLia) and the second sub-link line (LL1b, . . . , LLib) may be at a right angle, and the second sub-link line (LL1b, . . . , LLib) and the third sub-link line (LL1c, . . . , LLic) may be at a right angle. The first sub-link lines (LL1a, . . . , LLia) may be parallel to one another, the second sub-link lines (LL1b, . . . , LLib) may be parallel to one another, and the third sub-link lines (LL1c, . . . , LLic) may be parallel to one another. For example, a virtual line (VLLb) obtained by connecting the centers of the second sub-link lines (LL1b, . . . , LLib) may be formed in a direction in which the size of the bezel (BZ) may not be increased. For example, an angle between the gate line and the virtual line (VLLb) obtained by connecting the centers of the second sub-link lines (LL1b, . . . , LLib) may be acute. When the dummy gate block (DGB) is between the $0^{th}$ gate block (GB(0)) and the first gate block (1GB(1)), a virtual line (VLLb) obtained by connecting the centers of the second sub-link lines (LL1b, . . . , LLib) may be formed in a direction in which the size of the bezel (BZ) may not be increased. If an angle between the gate line and the virtual line (VLLb) obtained by connecting the centers of the second sub-link lines (LL1b, . . . , LLib) is obtuse, the virtual line (VLLb) obtained by connecting the centers of the second sub-link lines (LL1b, . . . , LLmb) may be formed in a direction in which the size of the bezel (BZ) may be increased, and the size of the bezel (BZ) may also be increased virtually. Thus, when the dummy gate block (DGB) is positioned on the boundaries between the non-rectangular portion and the rectangular portion of the display panel, the link lines included in the non-rectangular portion may include the bent portion, and the angle between the gate line and the virtual line (VLLb) obtained by connecting the centers of the second sub-link lines (LL1b, . . . , LLib) may be acute, e.g., to decrease the size of the bezel (BZ).

The length of the second sub-link line for connecting the $i^{th}$ gate block (1GB(i)) to the last gate line (the lowermost gate line) of the $i^{th}$ gate line group (1Pi) may be short, e.g., 0 or close to 0 units. For example, the first gate line group (2P1) positioned below the $i^{th}$ gate line group (1Pi) of the first area and included in the second area may not be connected to the gate block adjacent to the $i^{th}$ gate block (1GB(i)), but may be connected to the first gate block (2GB(1)) corresponding to the next gate block. Thus, the dummy gate block (DGB), which may not be connected to the gate line group, may be between the $i^{th}$ gate block (1GB(i)) of the first area and the first gate block (2GB(1)) of the second area. Due to the dummy gate block (DGB), the first gate block (2GB(1)) may not be positioned on the extended line of the first gate line group (2P1), so that the link line for connecting the first gate line group (2P1) of the second area with the first gate block (2GB(1)) may include the bent portion. In a similar manner, the link lines for connecting the gate blocks with the gate line groups positioned below the first gate line group (2P1) in the second area may include the second sub-link line, and the angle between the gate line and the virtual line obtained by connecting the centers of the second sub-link lines may be acute, so that it may be possible to decrease the size of the bezel (BZ). Thus, the angle between the gate line and the virtual line obtained by connecting the centers of the second sub-link lines may be acute angle, so that it may be possible to decrease the size of the non-display area (NDA) of the display panel.

Figure 9:
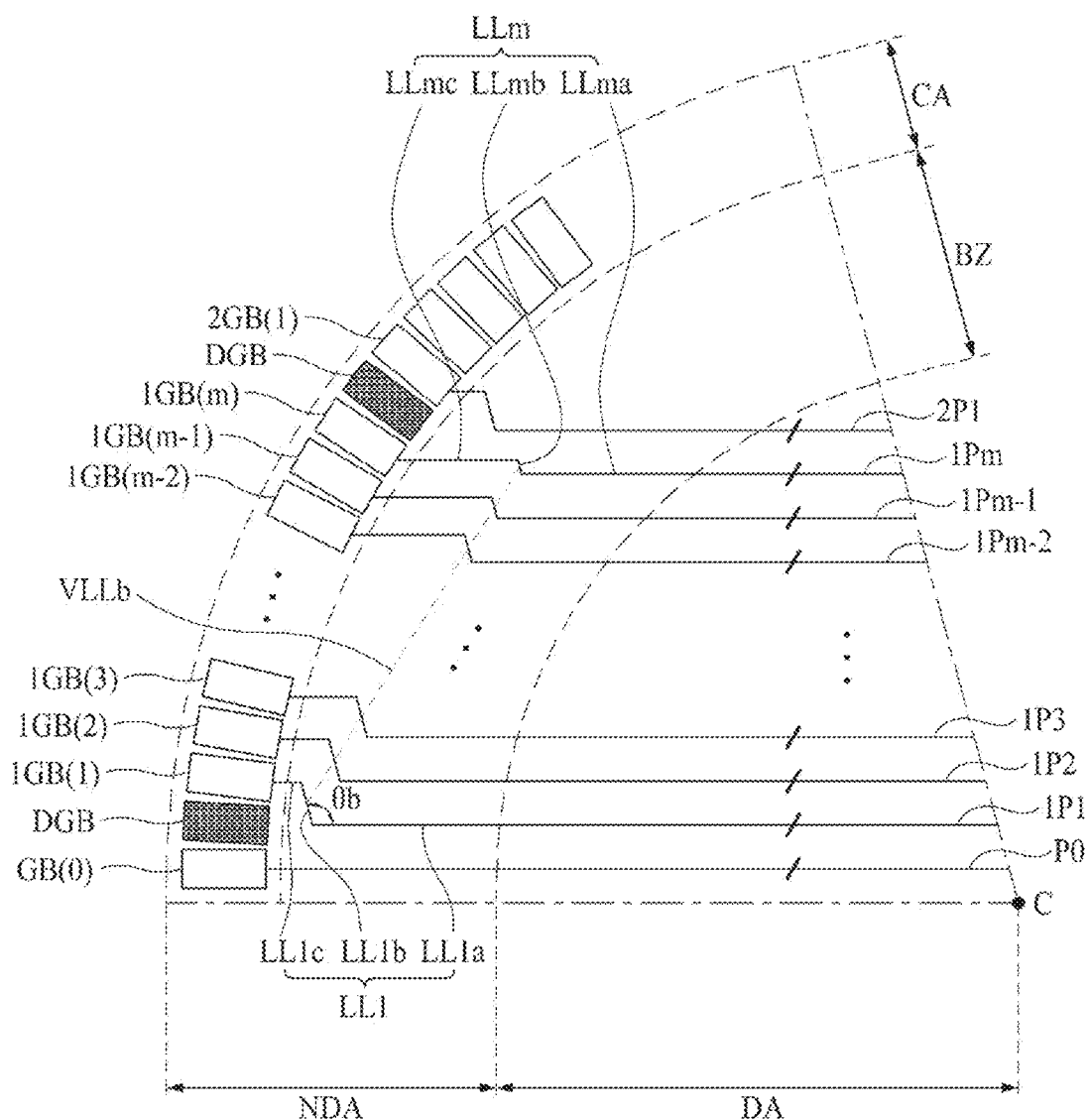
FIG. 9 is an enlarged view illustrating an example embodiment of a curved-line portion in the example display panels of FIGS. 5-6.

FIG. 9 is an enlarged view illustrating an example embodiment of a curved-line portion in the example display panels of FIGS. 5-6.

Except for a structure of a second sub-link line among the link lines, the structures of FIG. 9 are substantially identical to those of the FIG. 7 example. Thus, a repetitive description for the same parts as those of FIG. 7 will be shown in brief, or will be omitted.

In a similar manner as FIG. 7, the FIG. 9 example shows the non-rectangular portion of the curved line in the left upper portion of the display panel. The display panel may be divided into a display area (DA) and a non-display area (NDA). The non-display area (NDA) may be divided into a circuit area (CA) and a bezel (BZ).

In FIG. 9, the curved line showing each of the display area (DA), the bezel (BZ), and the circuit area (CA) is shown as the curved line having the same curvature with respect to the center (C) of the circle. However, the curvature of the curved line for defining the display area (DA) may be different from the curvature of the curved line for defining each of the bezel (BZ) and the circuit area (CA).

The non-rectangular portion may include 'm' pixel rows, and the plurality of pixels may be arranged in the 'm' pixel rows. The number of pixels in the first gate line group (1P1) may be larger than the number of pixels in the $m^{th}$ gate line group (1Pm). The non-rectangular portion may include the gate line groups from the first gate line group (1P1) to the $m^{th}$ gate line group (1Pm) in the first area, and the gate line groups from the first gate line group (2P1) to the $M^{th}$ gate line group in the second area above the $m^{th}$ gate line group (1Pm). For example, 'M' is an integer, 'M' is different from 'm', and 'M' is smaller than 'm'.

The circuit area (CA) may correspond to the area in which the gate driver for providing the gate signal to the pixels may be positioned. As described above, the plurality of gate stages may be arranged along the curved line. In a similar manner as FIG. 7, in the example of FIG. 9, the plurality of gate stages may be expressed as the "gate block," and may be connected to the gate line groups. As each of the gate blocks (1GB(1), 1GB(2), . . . , 1GB(m)) may be connected to each of the gate line groups (1P1, 1P2, . . . , 1Pm), each of the gate blocks (1GB(1), 1GB(2), . . . , 1GB(m)) may provide the gate signal to the pixels connected to the gate line groups (1P1, 1P2, . . . , 1Pm).

The bezel (BZ) may correspond to the area between the display area (DA) and the circuit area (CA), and the link lines for connecting the gate block with the gate line group may be provided in the bezel (BZ). The link lines (or the 'm'-numbered link lines) may include the extended lines of the gate lines, and the link lines (or each of the 'm'-numbered link lines) may include the first sub-link line, the second sub-link line, and the third sub-link line. The first link line (LL1) for connecting the first gate line group (1P1) and the first gate block (1GB(1)) to each other may include the first sub-link line (LL1a), the second sub-link line (LL1b), and the third sub-link line (LL1c). The $m^{th}$ link line (LLm) for connecting the $m^{th}$ gate line group (1Pm) and the $m^{th}$ gate block (1GB(m)) to each other may include the first sub-link line (LLma), the second sub-link line (LLmb), and the third sub-link line (LLmc).

In a similar manner as FIG. 7, the first gate line group (1P1) may not be connected to the gate block adjacent to the $0^{th}$ gate block (GB(0)), but may be connected to the first gate block (1GB(1)) corresponding to the next gate block. Thus, there may be a dummy gate block (DGB) between the $0^{th}$ gate block (GB(0)) and the first gate block (1GB(1)), and may be not connected to the gate line groups. Thus, as the first gate block (1GB(1)) may not be positioned on the extended line of the first gate line group (1P1) due to the dummy gate block (DGB), the first link line (LL1) for connecting the first gate line group (1P1) and the first gate block (1GB(1)) to each other may include the bent portion.

Each of the link lines (LL1, . . . , LLm) may include the first sub-link line (LL1a, . . . , LLma), the second sub-link line (LL1b, . . . , LLmb), and the third sub-link line (LL1c, . . . , LLmc). The first sub-link line (LL1a, . . . , LLma) may connect the first line group (1P1, . . . , 1Pm) to the second sub-link line (LL1b, . . . , LLmb), the second sub-link line (LL1b, . . . , LLmb) may connect the first sub-link line (LL1a, . . . , LLma) to the third sub-link line (LL1c, . . . , LLmc), and the third sub-link line (LL1c, . . . , LLmc) may connect the second sub-link line (LL1b, . . . , LLmb) to the gate block (1GB(1), . . . , 1GB(m)).

The first sub-link line (LL1a, . . . , LLma) and the third sub-link line (LL1c, . . . , LLmc) may be parallel to the gate line, and an angle between the gate line and the second sub-link line (LL1b, . . . , LLmb) may be obtuse. When the angle (θb) between the gate line and the second sub-link line (LL1b, . . . , LLmb) is obtuse, an interval between each of the link lines (LL1, . . . , LLm) may be formed in a direction in which the size of the bezel (BZ) may not be increased, in comparison to a case in which the gate line and the second sub-link line (LL1b, . . . , LLmb) are at right angle. Thus, the angle (θb) between the gate line and the second sub-link line (LL1b, . . . , LLmb) may be obtuse, so that it may be possible to decrease the size of the bezel (BZ). The first sub-link lines (LL1a, . . . , LLma) may be parallel to one another, the second sub-link lines (LL1b, . . . , LLmb) may be parallel to one another, and the third sub-link lines (LL1c, . . . , LLmc) may be parallel to one another. For example, a virtual line (VLLb) obtained by connecting the centers of the second sub-link lines (LL1b, . . . , LLmb) may be formed in a direction in which the size of the bezel (BZ) may not be increased. For example, an angle between the gate line and the virtual line (VLLb) obtained by connecting the centers of the second sub-link lines (LL1b, . . . , LLmb) may be acute. When the dummy gate block (DGB) is between the $0^{th}$ gate block (GB(0)) and the first gate block (1GB(1)), the virtual line (VLLb) obtained by connecting the centers of the second sub-link lines (LL1b, . . . , LLmb) may be formed in a direction in which the size of the bezel (BZ) may not be increased. Thus, when the dummy gate block (DGB) is on the boundaries between the non-rectangular portion and the rectangular portion of the display panel, the link lines included in the non-rectangular portion may include the bent portion, the angle between the gate line and the virtual line (VLLb) obtained by connecting the centers of the second sub-link lines (LL1b, . . . , LLmb) may be acute, and the angle between the gate line and the second sub-link lines (LL1b, . . . , LLmb) may be obtuse, to decrease the size of the bezel (BZ). Thus, the size of the non-display area (NDA) in the display panel may be decreased.

In a similar manner as FIG. 7, the first gate line group (2P1) in the second area above the $m^{th}$ gate line group (1Pm) of the first area may not be connected to the gate block adjacent to the $m^{th}$ gate block (1GB(m)), but may be connected to the first gate block (2GB(1)) corresponding to the next gate block in the second area. Thus, the dummy gate block (DGB), which may not be connected to the gate line group, may be between the $m^{th}$ gate block (1GB(m)) of the first area and the first gate block (2GB(1)) of the second area. Due to the dummy gate block (DGB), the first gate block (1GB(1)) may not be positioned on the extended line of the first gate line group (2P1) in the second area, so that the link line for connecting the first gate line group (2P1) of the second area with the first gate block (2GB(1)) may include the bent portion. In a similar manner, the link lines for connecting the gate blocks with the gate line groups positioned below the first gate line group (2P1) in the second area may include the second sub-link line, the angle between the gate line and the virtual line obtained by connecting the centers of the second sub-link lines may be acute, and the angle (θb) between the gate line and the second sub-link line may be obtuse, so that it may be possible to decrease the size of the bezel (BZ).

Figure 10:
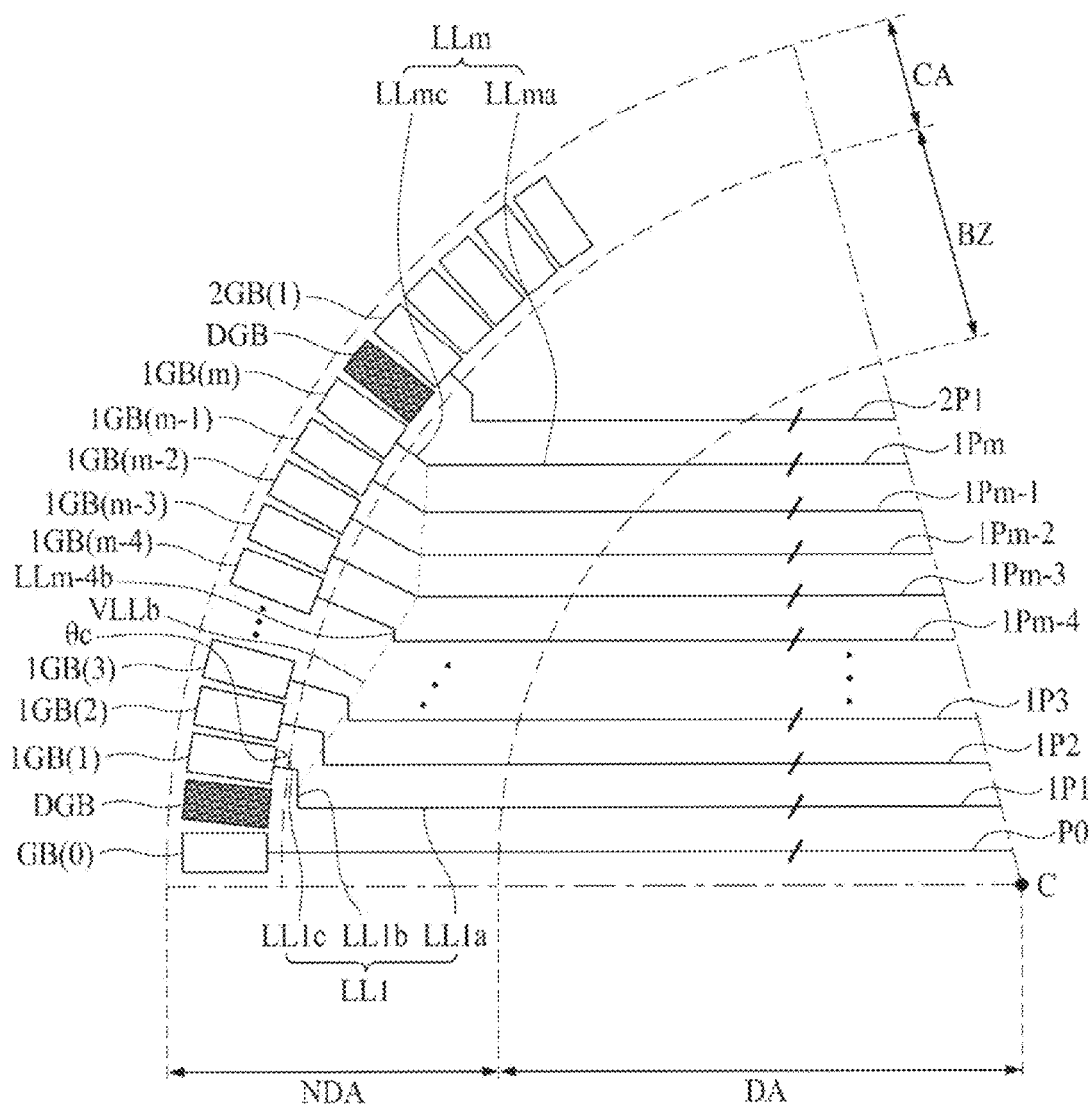
FIG. 10 is an enlarged view illustrating an example embodiment of a curved-line portion in the example display panels of FIGS. 5-6.

FIG. 10 is an enlarged view illustrating an example embodiment of a curved-line portion in the example display panels of FIGS. 5-6.

Except for a structure of a third sub-link line among link lines, the structures of FIG. 10 are substantially identical to those of the FIG. 7 example. Thus, a repetitive description for the same parts as those of FIG. 7 will be shown in brief, or will be omitted.

In a similar manner as FIG. 7, the FIG. 10 example shows the non-rectangular portion of the curved line in the left upper portion of the display panel. The display panel may be divided into a display area (DA) and a non-display area (NDA). The non-display area (NDA) may be divided into a circuit area (CA) and a bezel (BZ).

In FIG. 10, the curved line showing each of the display area (DA), the bezel (BZ), and the circuit area (CA) is shown as the curved line having the same curvature with respect to the center (C) of the circle. However, the curvature of the curved line for defining the display area (DA) may be different from the curvature of the curved line for defining each of the bezel (BZ) and the circuit area (CA).

The non-rectangular portion may include 'm' pixel rows, a plurality of pixels may be arranged in the 'm' pixel rows, and the non-rectangular portion may include the gate line groups from the first gate line group (1P1) to the $m^{th}$ gate line group (1Pm). The number of pixels in the first gate line group (1P1) may be larger than the number of pixels arranged in the $m^{th}$ gate line group (1Pm). The non-rectangular portion may include the gate line groups from the first gate line group (1P1) to the $m^{th}$ gate line group (1Pm) in the first area, and the gate line groups from the first gate line group (2P1) to the $M^{th}$ gate line group in the second area above the $m^{th}$ gate line group (1Pm). For example, 'M' is an integer, 'M' is different from 'm', and 'M' is smaller than 'm'.

The circuit area (CA) may correspond to the area in which the gate driver for providing the gate signal to the pixels may be positioned. As described above, the plurality of gate stages may be arranged along the curved line. In a similar manner as FIG. 7, in the example of FIG. 10, the plurality of gate stages may be expressed as the "gate block," and may be connected to the gate line groups. The gate block may include the plurality of gate stages. As each of the gate blocks (1GB(1), 1GB(2), 1GB(3), ..., 1GB(m-4), 1GB(m-3), 1GB(m-2), 1GB(m-1), 1GB(m)) may be connected to each of the gate line groups (1P1, 1P2, ..., 1Pm-4, 1Pm-3, 1Pm-2, 1Pm-1, 1Pm), each of the gate blocks (1GB(1), 1GB(2), 1GB(3), ..., 1GB(m-4), 1GB(m-3), 1GB(m-2), 1GB(m-1), 1GB(m)) may provide the gate signal to the pixels connected to the gate line groups (1P1, 1P2, ..., 1Pm-4, 1Pm-3, 1Pm-2, 1Pm-1, 1Pm).

The bezel (BZ) may correspond to the area between the display area (DA) and the circuit area (CA), and the link lines for connecting the gate block with the gate line group may be in the bezel (BZ). The link lines (or the 'm'-numbered link lines) may include the extended lines of the gate lines, and the link lines (or each of the 'm'-numbered link lines) may include the first sub-link line, the second sub-link line, and the third sub-link line. The first link line (LL1) for connecting the first gate line group (1P1) and the first gate block (1GB(1)) to each other may include the first sub-link line (LL1a), the second sub-link line (LL1b), and the third sub-link line (LL1c). The $m^{th}$ link line (LLm) for connecting the $m^{th}$ gate line group (1Pm) and the $m^{th}$ gate block (1GB(m)) to each other may include the first sub-link line (LLma), the second sub-link line (LLmb), and the third sub-link line (LLmc).

The first gate line group (1P1) may not be connected to the gate block adjacent to the $0^{th}$ gate block (GB(0)), but may be connected to the first gate block (1GB(1)) corresponding to the next gate block. Thus, there may be a dummy gate block (DGB) between the $0^{th}$ gate block (GB(0)) and the first gate block (1GB(1)), and which may not be connected to the gate line groups. Thus, as the first gate block (1GB(1)) is not on the extended line of the first gate line group (1P1) due to the dummy gate block (DGB), the first link line (LL1) for connecting the first gate line group (1P1) and the first gate block (1GB(1)) to each other may include the bent portion.

Each of the link lines (LL1, ..., LLm) may include the first sub-link line (LL1a, ..., LLma), the second sub-link line (LL1b, ..., LLmb), and the third sub-link line (LL1c, ..., LLmc). The first sub-link line (LL1a, ..., LLma) may connect the gate line group (1P1, ..., 1Pm) to the second sub-link line (LL1b, ..., LLmb), the second sub-link line (LL1b, ..., LLmb) may connect the first sub-link line (LL1a, ..., LLma) to the third sub-link line (LL1c, ..., LLmc), and the third sub-link line (LL1c, ..., LLmc) may connect the second sub-link line (LL1b, ..., LLmb) to the gate block (1GB(1), ..., 1GB(m)).

The first sub-link line (LL1a, ..., LLma) may be the extended line of the gate line, and may be the parallel to the gate line. The second sub-link line (LL1b, ..., LLmb) may be perpendicular to the first sub-link line (LL1a, ..., LLma). An angle (θc) between the third sub-link line (LL1c, ..., LLmc) and the gate block (1GB(1), ..., 1GB(m)) may be a right angle, and the third sub-link line (LL1c, ..., LLmc) may be on the virtual line obtained by connecting the gate block (1GB(1), ..., 1GB(m)) and the center (C) of the circle to each other. For example, when the third sub-link line (LL1c, ..., LLmc) is arranged in a radial shape, an interval between each of the link lines may be provided in such a manner that an interval between the first link line (LL1) and the second sub-link line (LL2) may be the same as an interval between the $(m-1)^{th}$ link line (LLm-1) and the $m^{th}$ link line (LLm). In the respective link lines from the first link line (LL1) to the $(m-4)^{th}$ link line (LLm), the length of each of the second sub-link lines (LL1b, ..., LLm-4b) may be gradually decreased from the second sub-link line (LL1b) of the first link line (LL1) toward the second sub-link line (LLm-4b) of the $(m-4)^{th}$ link line (LLm). In the FIG. 10 example, the respective third sub-link lines (LL1c, ..., LLmc) of the link lines (LL1, ..., LLm) may be formed at a certain angle (θc) without being parallel to the gate line, and the second sub-link lines (LL1b, ..., LLmb) may not be provided in the link lines from the $(m-3)^{th}$ link lines to the $m^{th}$ link line (LLm). For example, the second sub-link line may be provided in each of the link lines from the first link line (LL1) to the $(m-4)^{th}$ link line (LLm-4), and the second sub-link line may not be provided in each of the $(m-3)^{th}$ link line (LLm-3) to the $m^{th}$ link line (LLm). Thus, each of the link lines from the $(m-3)^{th}$ link line (LLm-3) for connecting the $(m-3)^{th}$ gate line group (Pm-3) and the $(m-3)^{th}$ gate block (1GB(m-3)) to each other to the $m^{th}$ link line (LLm) for connecting the $m^{th}$ gate line group (1Pm) and the $m^{th}$ gate block (1GB(m)) to each other may be formed with only the first sub-link line (LLm-3a, LLma) and the third sub-link line (LLm-3c, ..., LLmc).

A virtual line (VLLb) obtained by connecting the centers of the respective second sub-link lines (LL1b, ..., LLm-4b)

in the link lines from the first link line (LL1) to the (m–4)$^{th}$ link line (LLm–4) may be formed in a direction in which the size of the bezel (BZ) may not be increased. For example, an angle between the gate line and the virtual line (VLLb) obtained by connecting the centers of the respective second sub-link lines (LL1b, . . . , LLm–4b) in the link lines from the first link line (LL1) to the (m–4)$^{th}$ link line (LLm–4) may be acute. When a dummy gate block (DGB) is between the 0$^{th}$ gate block (GB(0)) and the first gate block (1GB(1)), a virtual line obtained by connecting the centers of the second sub-link lines (LL1b, . . . , LLmb) in the link lines from the first link line (LL1) to the m$^{th}$ link line (LLm) may be formed in a direction in which the size of the bezel (BZ) may not be increased. Thus, when the dummy gate block (DGB) is on the boundaries between the non-rectangular portion and the rectangular portion of the display panel, the link lines included in the non-rectangular portion may include the bent portion, the angle between the gate line and the virtual line (VLLb) obtained by connecting the centers of the respective second sub-link lines (LL1b, . . . , LLm–4b) in the link lines from the first link line (LL1) to the (m–4)$^{th}$ link line (LLm–4) may be acute, and the angle between the gate block (1GB(1)), . . . , 1GB(m)) and the third sub-link lines (LL1c, . . . , LLmc) may be a right angle, to decrease the size of the bezel (BZ), and thus, to decrease the size of the non-display area (NDA) in the display panel.

In a similar manner as in the example of FIG. 7, the first gate line group (2P1) in the second area above the m$^{th}$ gate line group (1Pm) of the first area may not be connected to the gate block adjacent to the m$^{th}$ gate block (1GB(m)), but may be connected to the first gate block (2GB(1)) corresponding to the next gate block. Thus, the dummy gate block (DGB), which may not be connected to the gate line group, may be between the m$^{th}$ gate block (1GB(m)) of the first area and the first gate block (2GB(1)) of the second area. Due to the dummy gate block (DGB), the first gate block (2GB(1)) may not be positioned on the extended line of the first gate line group (2P1) in the second area, so that the link line for connecting the first gate line group (2P1) to the first gate block (2GB(1)) may include the bent portion. In a similar manner, the link lines for connecting the gate blocks with the gate line groups positioned below the first gate line group (2P1) in the second area may include the second sub-link line, the angle between the gate line and the virtual line obtained by connecting the centers of the second sub-link lines may be acute, and the angle between the gate block and the third sub-link line may be a right angle, so that it may be possible to decrease the size of the bezel (BZ).

Figure 11:
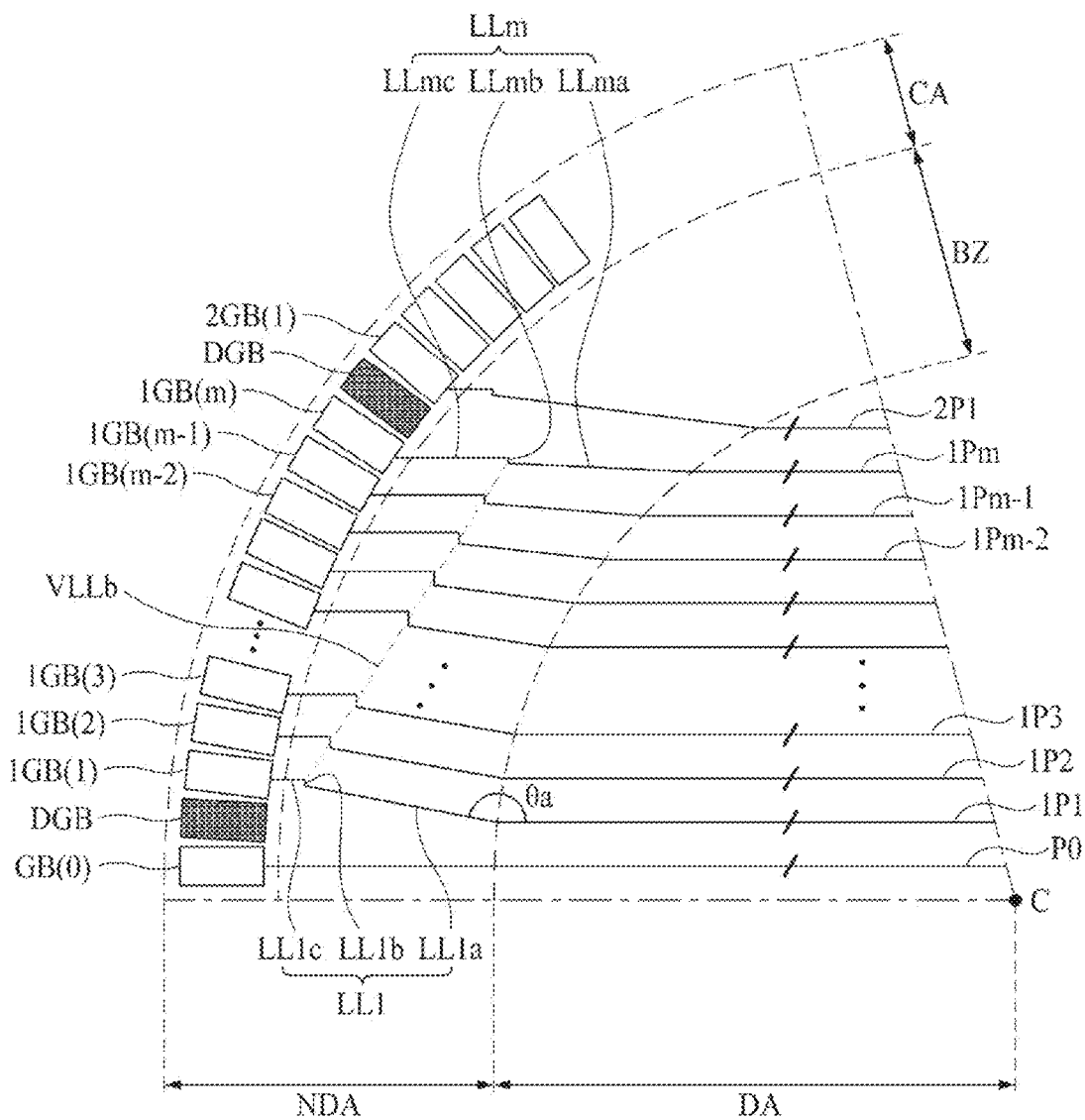
FIG. 11 is an enlarged view illustrating an example embodiment of a curved-line portion in the example display panels of FIGS. 5-6.

FIG. 11 is an enlarged view illustrating an example embodiment of a curved-line portion in the example display panels of FIGS. 5-6.

Except for a structure of a second sub-link line among link lines, the structures of FIG. 11 are substantially identical to those of the first embodiment. Thus, a repetitive description for the same parts as those of FIG. 7 will be shown in brief, or will be omitted.

In a similar manner as the FIG. 7 example, FIG. 11 shows the non-rectangular portion of the curved line in the left upper portion of the display panel. The display panel may be divided into a display area (DA) and a non-display area (NDA). The non-display area (NDA) may be divided into a circuit area (CA) and a bezel (BZ).

In the example of FIG. 11, the curved line showing each of the display area (DA), the bezel (BZ), and the circuit area (CA) is shown as the curved line having the same curvature with respect to the center (C) of the circle. However, the curvature of the curved line for defining the display area (DA) may be different from the curvature of the curved line for defining each of the bezel (BZ) and the circuit area (CA).

The non-rectangular portion may include 'm' pixel rows, a plurality of pixels may be arranged in the 'm' pixel rows, and the non-rectangular portion may include the gate line groups from the first gate line group (1P1) to the m$^{th}$ gate line group (1Pm). The number of pixels in the first gate line group (1P1) may be larger than the number of pixels in the m$^{th}$ gate line group (1Pm). The gate line groups having an identification number less than 'm' may be included in the second area above the m$^{th}$ gate line group (1Pm) of the first area.

The circuit area (CA) may correspond to the area in which the gate driver for providing the gate signal to the pixels may be positioned. As described above, the plurality of gate stages may be arranged along the curved line. In a similar manner as FIG. 7, in the example of FIG. 11, the plurality of gate stages may be expressed as the "gate block," and may be connected to the gate line groups. The gate block may include the plurality of gate stages. As each of the gate blocks (1GB(1), 1GB(2), . . . , 1GB(m)) may be connected to each of the gate line groups (1P1, 1P2, . . . , 1Pm), each of the gate blocks (1GB(1), 1GB(2), . . . , 1GB(m)) may provide the gate signal to the pixels connected to the gate line groups (1P1, 1P2, . . . , 1Pm).

The bezel (BZ) may correspond to the area between the display area (DA) and the circuit area (CA), and the link lines for connecting the gate block with the gate line group may be provided in the bezel (BZ). The link lines (or the 'm'-numbered link lines) may include the extended lines of the gate lines, and the link lines (or each of the 'm'-numbered link lines) may include the first link line, the second sub-link line, and the third sub-link line. The first link line (LL1) for connecting the first gate line group (1P1) and the first gate block (1GB(1)) to each other may include the first sub-link line (LL1a), the second sub-link line (LL1b), and the third sub-link line (LL1c). The m$^{th}$ link line (LLm) for connecting the m$^{th}$ gate line group (1Pm) and the m$^{th}$ gate block (1GB(m)) to each other may include the first sub-link line (LLma), the second sub-link line (LLmb), and the third sub-link line (LLmc).

The first gate line group (1P1) may not be connected to the gate block adjacent to the 0$^{th}$ gate block (GB(0)), but may be connected to the first gate block (1GB(1)) corresponding to the next gate block. Thus, there may be a dummy gate block (DGB) between the 0$^{th}$ gate block (GB(0)) and the first gate block (1GB(1)), and may not be connected to the gate line groups. Thus, as the first gate block (1GB(1)) may not be positioned on the extended line of the first gate line group (1P1) due to the dummy gate block (DGB), the first link line (LL1) for connecting the first gate line group (1P1) and the first gate block (1GB(1)) to each other may include the bent portion.

Each of the link lines (LL1, . . . , LLm) may include the first sub-link line (LL1a, . . . , LLma), the second sub-link line (LL1b, . . . , LLmb) and the third sub-link line (LL1c, . . . , LLmc). The first sub-link line (LL1a, . . . , LLma) may connect the gate line group (1P1, . . . , 1Pm) to the second sub-link line (LL1b, . . . , LLmb), the second sub-link line (LL1b, . . . , LLmb) may connect the first sub-link line (LL1a, . . . , LLma) to the third sub-link line (LL1c, . . . , LLmc), and the third sub-link line (LL1c, . . . , LLmc) may connect the second sub-link line (LL1b, . . . , LLmb) to the gate block (1GB(1), . . . , 1GB(m)).

The third sub-link line (LL1c, . . . , LLmc) may be parallel to the gate line. The second sub-link line (LL1b, . . . , LLmb)

may be perpendicular to the third sub-link line (LL1c, ..., LLmc) and the gate line. The first sub-link line (LL1a, ..., LLma) may be on the line obtained by connecting one end of the gate line group with the gate block (1GB(1), ..., 1GB(m)). For example, an angle (θa) between the gate line and the first sub-link line (LL1a, ..., LLma) may be obtuse, and an angle between the gate line and each of the first sub-link lines (LL1a, ..., LLma) may be changed at every first sub-link line (LL1a, ..., LLma). In the respective link lines from the first link line (LL1) to the $m^{th}$ link line (LLm), the angle between the gate line and the first sub-link line (LL1a, ..., LLma) may be provided in such a manner that the angle may be gradually increased from the first sub-link line (LL1a) of the first link line (LL1) to the first link line (LL1m) of the $m^{th}$ link line (LLm). For example, an interval between each of the first sub-link lines (LL1a, ..., LLma) may be constantly maintained as an interval between each of the gate lines in the display area (DA), e.g., at minimum, without being concentrated into any one point. A virtual line (VLLb) obtained by connecting the centers of the second sub-link lines (LL1b, ..., LLmb) may be formed in a direction in which the size of the bezel (BZ) may not be increased. For example, an angle between the gate line and the virtual line (VLLb) obtained by connecting the centers of the second sub-link lines (LL1b, ..., LLmb) may be acute. When a dummy gate block (DGB) is between the $0^{th}$ gate block (GB(0)) and the first gate block (1GB(1)), the virtual line (VLLb) obtained by connecting the centers of the second sub-link lines (LL1b, ..., LLmb) may be formed in a direction in which the size of the bezel (BZ) may not be increased. Thus, when the dummy gate block (DGB) is on the boundaries between the non-rectangular portion and the rectangular portion of the display panel, the link lines included in the non-rectangular portion may include the bent portion, the angle between the gate line and the virtual line (VLLb) obtained by connecting the centers of the second sub-link lines (LL1b, ..., LLmb) may be acute, and the angle between the gate line and the second sub-link lines (LL1b, ..., LLmb) may be obtuse, to decrease the size of the bezel (BZ), and thus, to decrease the size of the non-display area (NDA) in the display panel.

In a similar manner as FIG. 7, the first gate line group (2P1) in the second area above the $m^{th}$ gate line group (1Pm) of the first area may not be connected to the gate block adjacent to the $m^{th}$ gate block (1GB(m)) of the first area, but may be connected to the first gate block (2GB(1)) corresponding to the next gate block in the second area. Thus, the dummy gate block (DGB), which may not be connected to the gate line group, may be between the $m^{th}$ gate block (1GB(m)) of the first area and the first gate block (2GB(1)) of the second area. Due to the dummy gate block (DGB), the first gate block (2GB(1)) may not be positioned on the extended line of the first gate line group (2P1) in the second area, so that the link line for connecting the first gate line group (2P1) to the first gate block (2GB(1)) may include the bent portion. In a similar manner, the link lines for connecting the gate blocks with the gate line groups positioned below the first gate line group (2P1) in the second area may include the second sub-link line, the angle between the gate line and the virtual line obtained by connecting the centers of the second sub-link lines may be acute, and the angle (θc) between the gate block and the second sub-link line may be obtuse, so that it may be possible to decrease the size of the bezel (BZ).

In the examples of FIGS. 9-11, the curved line portion may be in the left upper portion of the display panel, but embodiments are not limited to these structures. For example, as shown in FIG. 8, the curved line portion may be applied to all non-rectangular portions of the display panel, e.g., in the left lower portion, right lower portion, or right upper portion. Also, the various structures of the link line described in the example embodiments of the present disclosure may be referred to as a multiple-stage arrangement.

A display panel according to an example embodiment of the present disclosure may be described as follows.

According to an embodiment of the present disclosure, a display panel may include: a display area including: a curved boundary in plan view, and a pixel array including pixel rows, and a non-display area in a periphery of the display area, and including: a curved boundary in plan view, a plurality of gate blocks arranged along the curved boundary of the non-display area, and at least one dummy block among the gate blocks, and a plurality of link lines configured to connect the gate blocks to the pixel rows, at least one of the link lines being multi-segmented to may include a plurality of segments oriented in different directions in plan view.

For example, in the display panel according to an embodiment of the present disclosure, a curvature of the curved boundary of the display area may be different from a curvature of the curved boundary of the non-display area. For example, in the display panel according to an embodiment of the present disclosure, the curved boundary of the non-display area may be an outer boundary.

For example, in the display panel according to an embodiment of the present disclosure, the plurality of gate blocks may include first to $m^{th}$ gate blocks, 'm' being an integer, a number of pixels connected to the first gate block may be larger than a number of pixels connected to the $m^{th}$ gate block, and the dummy block may be adjacent to the first gate block. For example, in the display panel according to an embodiment of the present disclosure, each of a plurality of 'm'-numbered multi-segmented link lines, among the plurality of link lines, in the non-display area, 'm' being an integer, may include: a first sub-link line, a second sub-link line, and a third sub-link line, the second sub-link line may connect the first sub-link line to the third sub-link line, and the second sub-link lines may be parallel to one another.

For example, in the display panel according to an embodiment of the present disclosure, a number of link lines connected to the gate blocks arranged along the curved boundary of the non-display area of the display panel may be a multiple of 'm', 'm' being an integer, each of the link lines, among the multiple of 'm' link lines, may include: a first sub-link line, a second sub-link line, and a third sub-link line, the first sub-link line may be connected to the gate line, and the second sub-link line may connect the first sub-link line to the third sub-link line.

For example, in the display panel according to an embodiment of the present disclosure, a virtual line may be defined by connecting the centers of the second sub-link lines, and an acute angle may be between the virtual line and the gate line or between the virtual line and the first sub-link line. For example, in the display panel according to an embodiment of the present disclosure, an obtuse angle may be between the first sub-link line and the gate line.

For example, in the display panel according to an embodiment of the present disclosure, the first sub-link line and the second sub-link line may be perpendicular to each other, and the second sub-link line and the third sub-link line may be perpendicular to each other. For example, in the display panel according to an embodiment of the present disclosure, a right angle or an obtuse angle may be between the second sub-link line and the first sub-link line or between the second sub-link line and the gate line. For example, in the display panel according to an embodiment of the present disclosure, the third sub-link line may be parallel to the first sub-link line or the gate line, and the third sub-link line may be on a virtual line obtained by connecting the gate block and a center of the curved-boundary of the non-display area.

According to an embodiment of the present disclosure, a display panel, including a non-rectangular portion divided into at least a first area and a second area, may include: a non-rectangular portion including: a first area, and a second area, 'x'-numbered gate lines in the first area, and 'y'-numbered gate lines in the second area, where x>y, and each of 'x' and 'y' may be an integer), a gate driver configured to transmit respective gate signals to the gate lines, a dummy block in the second area, the dummy block being adjacent to the first area, and a plurality of link lines, each configured to connect the gate driver to a corresponding one of the gate lines.

For example, in the display panel according to an embodiment of the present disclosure, the plurality of link lines may include: a first link line in the first area and nearest to the second area, the first link line being a straight line, and a second link line in the first area and farther from the second area than the first link line, the second link line being multi-segmented to may include a plurality of segments oriented in different directions in plan view. For example, in the display panel according to an embodiment of the present disclosure, the gate driver may include a plurality of gate blocks, and the plurality of gate blocks may be arranged in a radial shape in the non-rectangular portion.

For example, in the display panel according to an embodiment of the present disclosure, in the second area, the dummy block may be closer to the first area than a first gate block, among the plurality of gate blocks, is to the first area. For example, in the display panel according to an embodiment of the present disclosure, the gate block may be configured to provide a signal to a plurality of gate lines, and a single gate line may be connected to at least two pixel rows.

For example, in the display panel according to an embodiment of the present disclosure, the plurality of link lines may be in a bezel, at least some of the plurality of link lines each may include: a first bent point, and a second bent point, and a virtual line, obtained by connecting the first bent points or second bent points of the at least some of the plurality of link lines in the first area and the second area, may be along a direction in which the bezel does not increase in size. For example, in the display panel according to an embodiment of the present disclosure, an angle between the virtual line and the gate line may be an acute angle. For example, in the display panel according to an embodiment of the present disclosure, a segment connecting the first bent point and the second bent point in each of the some of the plurality of link lines may be at a right angle or an obtuse angle with respect to the corresponding one of the gate lines.

According to an embodiment of the present disclosure, a display panel may include: a display area including a plurality of pixels, a circuit area including a gate driver, and a bezel including a plurality of link lines configured to connect the gate driver to the plurality of pixels. The display panel may be divided into a rectangular portion and a non-rectangular portion. A first link line, among the plurality of link lines, in the rectangular portion may be a single segment. A second link line, among the plurality of link lines, in the non-rectangular portion may include a multi-segmented line including a plurality of sub-link lines oriented in different directions in plan view. The non-rectangular portion may include a plurality of dummy gate drivers.

For example, in the display panel according to an embodiment of the present disclosure, the non-rectangular portion may be in each of a lower end portion and an upper end portion of the display panel. For example, in the display panel according to an embodiment of the present disclosure, the display panel may have a circular shape.

For example, in the display panel according to an embodiment of the present disclosure, a size of the bezel in the rectangular portion may be constant, and a size of the bezel in the non-rectangular portion may be not constant. For example, in the display panel according to an embodiment of the present disclosure, a curvature of the non-rectangular portion in the circuit area may be different from a curvature of the display area.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A display panel, comprising:
    a display area including a curved portion and a straight portion;
    a non-display area in a periphery of the display area, the non-display area including:
        a bezel surrounding the display area; and
        a circuit area surrounding the bezel area;
    a pixel array comprising pixel rows in the display area;
    a plurality of gate blocks arranged in the circuit area along the curved portion between the circuit area and the bezel;
    at least one dummy block among the gate blocks in the circuit area; and
    a plurality of link lines including:
        a first sub-link line configured to connect to a gate line connected to the pixel row and parallel to the gate line along the curved portion;
        a third sub-link line configured to connect to the gate blocks, and parallel to the first sub-link line along the curved portion; and
        a second sub-link line configured to connect the first sub-link line to the third sub-link line, the second sub-link line being directly connected between the first sub-link line and the third sub-link line,
    wherein the first sub-link line and the third-link line are located at different positions in a y-direction in a plan view, and
    wherein an angle is between the second sub-link line and the first sub-link line.

2. The display panel of claim 1, wherein:
    the plurality of gate blocks comprises first to $m^{th}$ gate blocks, 'm' being an integer;
    a number of pixels connected to the first gate block is larger than a number of pixels connected to the $m^{th}$ gate block; and
    the dummy block is adjacent to the first gate block.

3. The display panel of claim 1, wherein:
    the plurality of link lines includes each of a plurality of 'm'-numbered link lines, among the plurality of link lines, in the non-display area, 'm' being an integer; and
    the second sub-link lines are parallel to one another.

4. The display panel of claim 3, wherein:
a virtual line is defined by connecting the centers of the second sub-link lines; and
an acute angle is between the virtual line and the gate line or between the virtual line and the first sub-link line.

5. The display panel of claim 1, wherein an obtuse angle is between the first sub-link line and the gate line.

6. A display panel having a non-rectangular portion, and divided into at least a first area and a second area, comprising:
a display area;
a non-display area in a periphery of the display area, the non-display area including:
a bezel surrounding the display area; and
a circuit area surrounding the bezel area;
'x'-numbered gate lines in the first area; and
'y'-numbered gate lines in the second area, where x>y, and each of 'x' and 'y' is an integer;
a gate driver configured to transmit respective gate signals to the gate lines, and disposed in the circuit area;
a dummy block in the second area, the dummy block being adjacent to the first area in the circuit area; and
a plurality of link lines in the bezel, each configured to connect the gate driver to a corresponding one of the gate lines,
wherein the plurality of link lines includes:
a first link line in the first area and nearest to the second area, the first link line being a straight line, and
a second link line in the second area and farther from the first area than the first link line,
wherein the second link line includes:
a first sub-link line configured to connect to the gate line, and parallel to the gate line, the first sub-link line extending to an inner boundary of the bezel,
a third sub-link line configured to connect to the gate blocks, and parallel to the first sub-link line, and
a second sub-link line configured to connect the first sub-link line to the third sub-link line, the second sub-link line being directly connected between the first sub-link line and the third sub-link line,
wherein the first sub-link line and the third-link line are located at different positions in a y-direction in a plan view, and
wherein an angle is between the second sub-link line and the first sub-link line.

7. The display panel of claim 6, wherein:
the gate driver comprises a plurality of gate blocks;
the plurality of gate blocks are arranged in a radial shape in the non-rectangular portion; and
each of the plurality of gate blocks is configured to provide a signal to a plurality of gate lines.

8. The display panel of claim 7, wherein, in the second area, the dummy block is closer to the first area than a first gate block, among the plurality of gate blocks, is to the first area.

9. The display panel of claim 6, wherein:
at least some of the plurality of second link lines each comprises:
a first bent point; and
a second bent point; and
a virtual line, obtained by connecting the first bent points or second bent points of the at least some of the plurality of second link lines in the second area, is along a direction in which the bezel does not increase in size.

10. The display panel of claim 9, wherein an angle between the virtual line and the gate line is an acute angle.

11. A display panel, comprising:
a display area comprising a plurality of pixels;
a circuit area comprising a gate driver; and
a bezel comprising a plurality of link lines configured to connect the gate driver to the plurality of pixels,
wherein the display panel is divided into a rectangular portion and a non-rectangular portion,
wherein a first link line, among the plurality of link lines, in the rectangular portion is a single segment,
wherein a second link line, among the plurality of link lines, in the non-rectangular portion comprises:
a first sub-link line configured to connect to a gate line connected to the pixel, and parallel to the gate line, the first sub-link line extending to an inner boundary of the bezel,
a third sub-link line configured to connect to the gate blocks, and parallel to the first sub-link line, and
a second sub-link line configured to connect the first sub-link line to the third sub-link line, the second sub-link line being directly connected between the first sub-link line and the third sub-link line,
wherein the first sub-link line and the third-link line are located at different positions in a y-direction in a plan view, and
wherein an angle is between the second sub-link line and the first sub-link line, and
wherein the non-rectangular portion comprises a plurality of dummy gate drivers.

12. The display panel of claim 11, wherein the non-rectangular portion is in each of a lower end portion and an upper end portion of the display panel.

13. The display panel of claim 11, wherein:
a size of the bezel in the rectangular portion is constant; and
a size of the bezel in the non-rectangular portion is not constant.

14. The display panel of claim 13, wherein a curvature of the non-rectangular portion in the circuit area is different from a curvature of the display area.

15. The display panel of claim 1, wherein:
the at least one comprises at least two dummy blocks; and
each of the at least two dummy blocks is disposed at regular intervals among the gate blocks.

16. The display panel of claim 6, wherein:
the at least one comprises at least two dummy blocks; and
each of the at least two dummy blocks is disposed at regular intervals among the gate blocks.

17. The display panel of claim 11, wherein each of the plurality of dummy gate drivers is disposed at regular intervals among the gate blocks.

* * * * *